(12) United States Patent
Kamon

(10) Patent No.: US 7,020,866 B2
(45) Date of Patent: Mar. 28, 2006

(54) MASK DATA PROCESSOR

(75) Inventor: Kazuya Kamon, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 392 days.

(21) Appl. No.: 10/397,520

(22) Filed: Mar. 27, 2003

(65) Prior Publication Data

US 2004/0060033 A1    Mar. 25, 2004

(30) Foreign Application Priority Data

Sep. 24, 2002    (JP)    ............... 2002-276855

(51) Int. Cl.
*G06F 17/50*    (2006.01)
(52) U.S. Cl. ......................... 716/19; 716/21
(58) Field of Classification Search ............ 716/19–21; 430/5, 22
See application file for complete search history.

(56) References Cited

U.S. PATENT DOCUMENTS

| 5,436,097 | A | * | 7/1995 | Norishima et al. ............ 430/5 |
| 5,923,563 | A | | 7/1999 | Lavin et al. |
| 6,093,631 | A | | 7/2000 | Jaso et al. |
| 6,711,732 | B1 | * | 3/2004 | Dai et al. ..................... 716/19 |
| 2002/0078428 | A1 | | 6/2002 | Lin |

FOREIGN PATENT DOCUMENTS

JP    10-247206    9/1998

* cited by examiner

*Primary Examiner*—Paul Dinh
(74) *Attorney, Agent, or Firm*—Oblon, Spivak, McClelland, Maier & Neustadt, P.C.

(57) ABSTRACT

Provided is a mask data processor capable of expanding a design data throughout the entire area of a mask. A storage device (MR) inputs a design data of sub-chips (D1) and mask data creation specification data (D2) to a pattern-density data generation device (10). Then, a data execution part (11) performs an arithmetic execution to the design data of sub-chips (D1) based on the mask data creation specification data (D2), followed by automatic mask data generation processing, layer arithmetic execution processing, and dummy pattern generation processing. When calculating a pattern graphic area, a graphic area calculation part (12) eliminates any overlap between graphics in order to avoid duplicate calculation. Based on the pattern graphic area, a pattern-density data calculation part (13) calculates the area ratios of graphic elements, i.e., pattern elements, contained in a unit region.

14 Claims, 18 Drawing Sheets

|            | 1st PROCESS | 2nd PROCESS | ... | Nth PROCESS |
|------------|-------------|-------------|-----|-------------|
| SUB-CHIP A |             |             |     |             |
| SUB-CHIP B |             | PATTERN DENSITY DATA | | |
| ...        |             |             |     |             |
| SUB-CHIP N |             |             |     |             |

F I G . 7
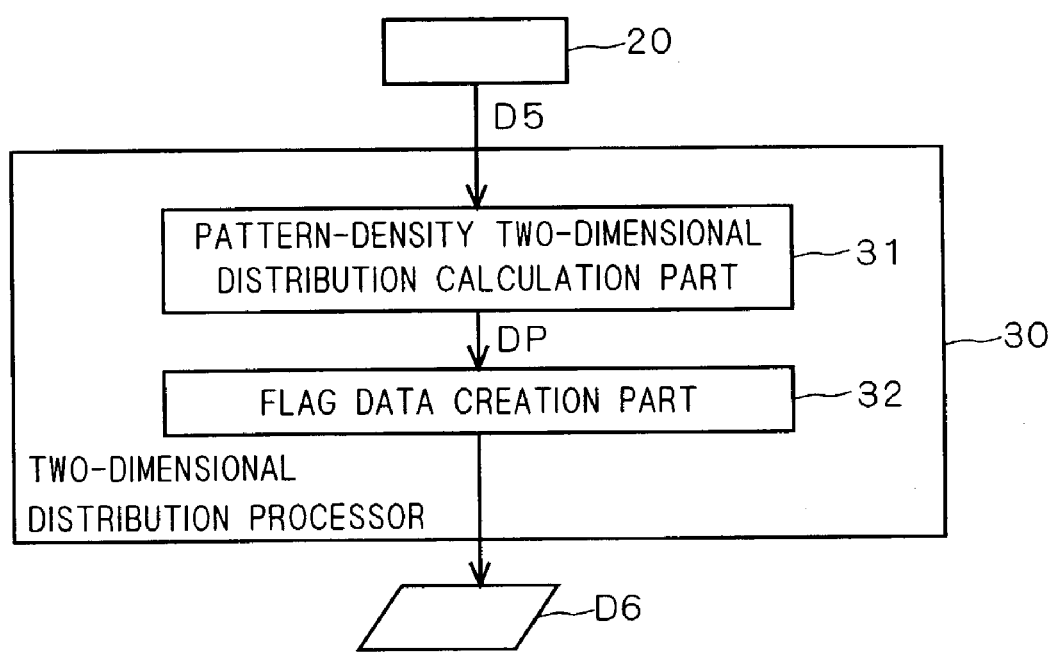

F I G. 8
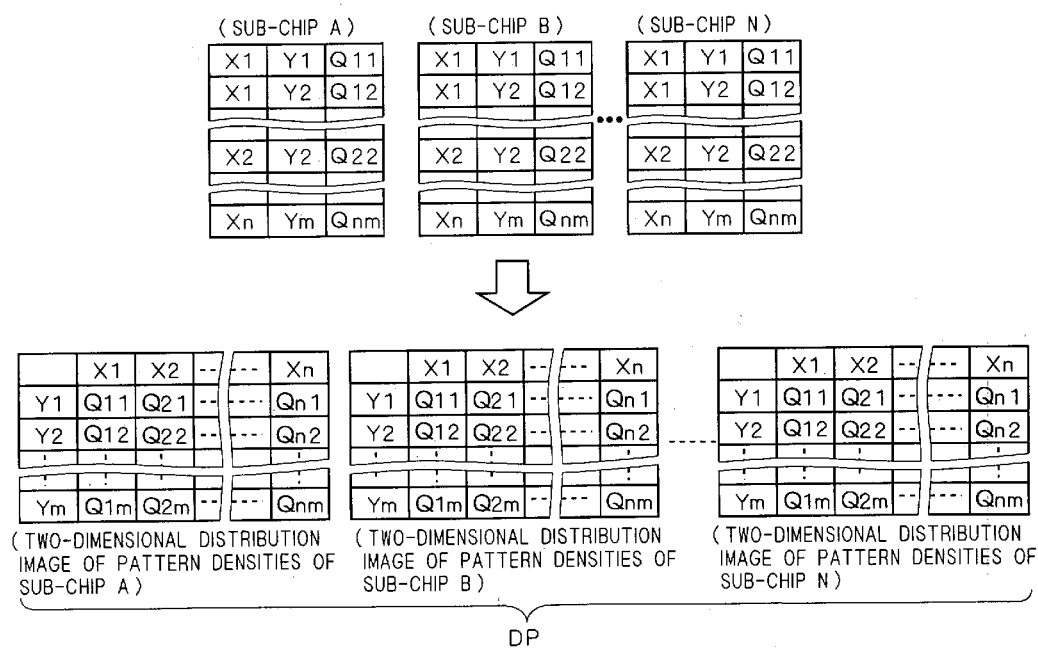

F I G . 1 0
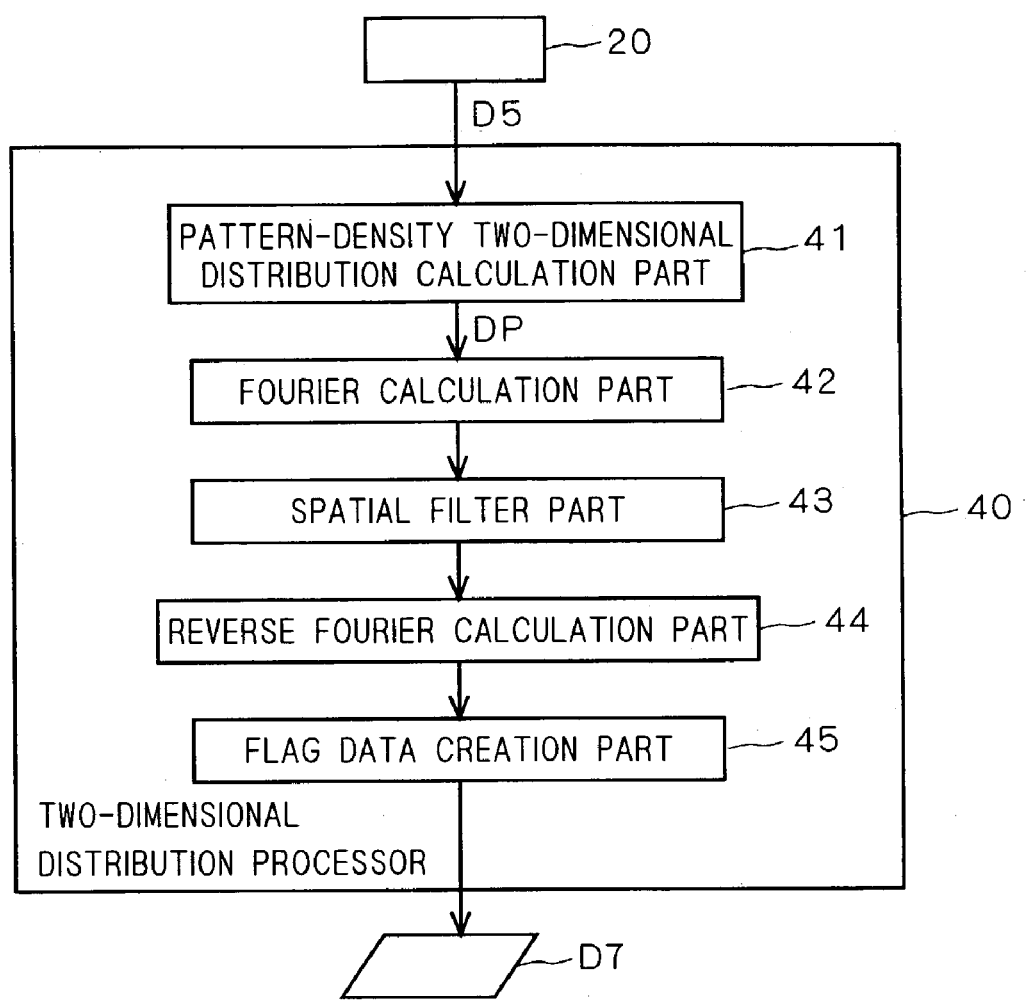

F I G . 1 9
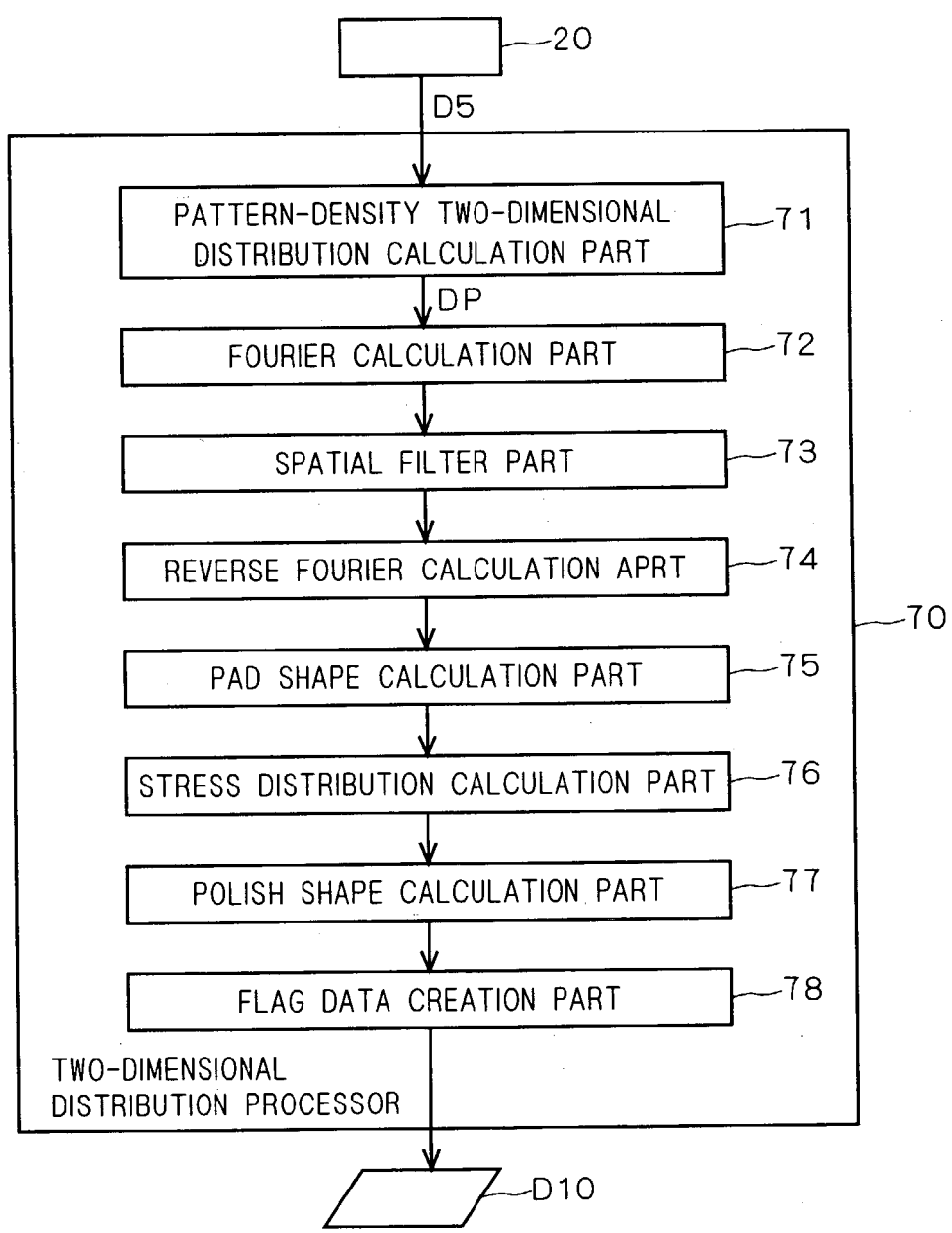

| | SUB-CHIP A | SUB-CHIP B | ... | SUB-CHIP N |
|---|---|---|---|---|
| 1st PROCESS | | | | |
| 2nd PROCESS | | FLAG DATA | | |
| ... | | | | |
| Nth PROCESS | | | | |

MASK DATA PROCESSOR

BACKGROUND OF THE INVENTION

1. Field of the Invention

The present invention relates to a mask data processor for transfer mask used in semiconductor device manufacturing.

2. Description of the Background Art

The miniaturization and high integration of large scale integrated circuits (LSIs) creates the tendency that circuit patterns formed on the LSIs have a minimum pattern dimension of 0.1 μm. A circuit pattern of an LSI can be formed by writing a design circuit on a transfer mask for implementing it on a semiconductor substrate by Laser or electron beam, and then performing a batch optical transfer of the transfer mask pattern onto the semiconductor substrate by a projection transfer apparatus.

The resolution R of the transfer apparatus is given by the following expression:

$$R = k1 \lambda / NA$$

wherein k1 is process constant, λ is waveform, and NA is numerical aperture.

The circuit pattern is formed by optical transfer method as described above, and a transfer in a defocus state produces a blurred image and thus image forming performance is deteriorated. Here, the extent of focus to which a predetermined image forming performance can be maintained is referred to as "depth of focus (DOF)" and given by the following expression:

$$DOF = k2 \lambda / NA^2$$

wherein k2 is process factor.

In the present condition that the fabrication dimension is being 0.1 μm, the depth of focus to be ensured optical theoretically is being only about 0.3 μm.

On the other hand, repetitive processes such as selective etching and film formation are executed on the semiconductor substrate and irregularities (substrate irregularities) occur on the surface of the semiconductor substrate.

The occurrence of substrate irregularities was not a serious problem in such semiconductor devices that integration degree is low and substrate irregularities is smaller than the depth of focus. However, as the fabrication dimension is smaller, the substrate irregularities is recently being larger than the depth of focus, making it difficult to obtain a predetermined image forming performance.

The substrate irregularities can be eliminated by for example the following methods: one in which some dummy patterns irrelevant to a real circuit pattern are properly disposed to increase the bulk of lower portions (i.e., dummy pattern method); and the other in which a semiconductor substrate is planarized by polishing so as to cut the irregularities generated thereon by chemical mechanical polishing (CMP) method.

Meanwhile, a technique of improving planarization is disclosed in a literature, for example, Japanese Patent Application Laid-Open No. 10-247206 (the 7th to 10th columns and FIG. 1). That is, setting window frame regions obtained by dividing a mask region into a mesh, the area pattern density per window frame region is calculated and a dummy pattern is disposed in a region of high area pattern density.

A general description of the planarization technique by CMP method is disclosed in a literature, for example, "ULSI Lithography Technical Innovation," pp 71–86, issued by Science Forum Corp.

For example, it is known that the correlation distance of a CMP process is extremely long, as much as 100 μm. Therefore, in order to perform a CMP process simulation, it is necessary to handle a layout data of full shot level about an LSI at a time. The design data of the LSI is enormous and there is for example the following problem. When this design data is unintentionally expanded to flat, its intermediate file and using memory become too large and a simulation apparatus exceeds its hardware limit, failing to execute the succeeding processing.

SUMMARY OF THE INVENTION

It is an object of the present invention to provide a mask data processor capable of analyzing a design data throughout the entire area of a mask.

The present invention is intended for a mask data processor for processing mask data of a transfer mask used for forming a semiconductor device configured by a plurality of sub-chips. According to the present invention, the mask data processor includes a pattern-density data generation device that processes design data of the sub-chips, respectively, and outputs the area pattern density per unit area of pattern graphics contained in the individual processes for forming the sub-chips, as pattern density data in units of sub-chips.

The handling of tremendous data for designing an LSI is facilitated because the pattern-density data generation device converts the design data of sub-chips to pattern density data of small scale in units of sub-chips.

These and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a block diagram to explain a two-dimensional distribution processor in the third preferred embodiment;

FIG. 8 is a diagram schematically illustrating the processing through which a pattern density data is expanded to two-dimension and a two-dimensional distribution image of pattern densities is obtained in units of processes;

FIG. 10 is a block diagram to explain a two-dimensional distribution processor in the fourth preferred embodiment;

FIG. 19 is a block diagram to explain a two-dimensional distribution processor in the seventh preferred embodiment;

DESCRIPTION OF THE PREFERRED EMBODIMENTS

Technical Idea of The Present Invention

When manufacturing a large scale integrated circuit (LSI), a plurality of LSIs called "sub-chips," including a TEG (test element group) and a process monitor, are also formed on a semiconductor substrate, in addition to a target LSI called "main chip." The plurality of sub-chips are formed in a region other than a region for forming the main chip.

Not only a circuit pattern of the main chip but also circuit patterns of the plurality of sub-chips are formed in a transfer mask used in the individual processes for forming the main chip and sub-chips on the semiconductor substrate.

To form the transfer mask, it is possible to use in the state that design data of the main chip and sub-chips are already synthesized. However, the actual LSI design data is tremendous and it is preferably split and processed. Therefore, the design data are often split in units of sub-chips and the split data are used sequentially.

Splitting design data in units of sub-chips facilitates the handling of tremendous design data. The present inventor has reached a technical idea that the handling of design data can be further facilitated by converting the design data in units of sub-chips to pattern density data of small scale.

A method of processing mask data of a transfer mask and a mask data processor based on this technical idea will be described in the following preferred embodiments. It should be noted that the mask data processor of the present invention is implemented by using a computer system and its software is created by using algorisms in the method of processing mask data according to the present invention.

A. First Preferred Embodiment

Followings are a pattern density data creating method and a pattern-density data generation device used in a mask data processing method and a mask data processor according to a first preferred embodiment of the present invention.

A-1. Pattern-Density Data Creating Method

The pattern-density data creating method will be described with reference to the configuration of a pattern-density data generation device 10 in FIG. 2 and by using the flowchart in FIG. 1.

Figure 1:
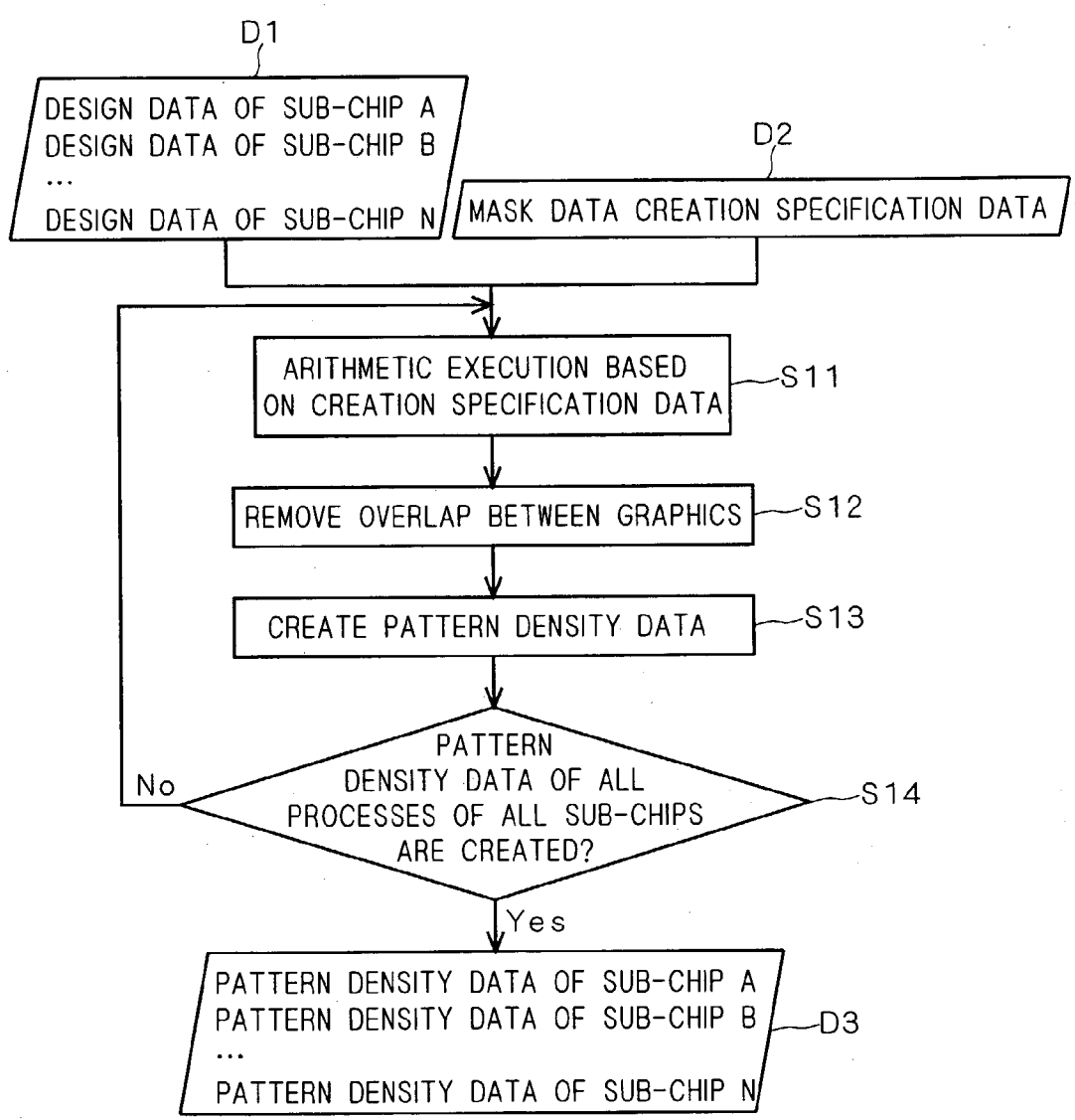
FIG. 1 is a flowchart to explain a pattern density data creating method according to a first preferred embodiment of the present invention.

Referring to FIG. 1, a pattern density data is created based on design data D1 about a plurality of sub-chips (sub-chips A to N) contained in a transfer mask, and mask data creation specification data D2 that define a dummy pattern generation specification and a layer arithmetic specification.

Specifically, when a layout data storage device MR inputs the sub-chip design data D1 and mask data creation specification data D2 to the pattern-density data generation device 10, a data execution part 11 subjects the sub-chip design data D1 to arithmetic execution based on the mask data creation specification data D2, followed by a mask data automatic generation processing, layer arithmetic processing, and dummy, pattern generation processing (step S11).

During these processings, some pattern graphics might be generated repetitively. Therefore, when a graphic area calculation part 12 calculates the areas of pattern graphics, any overlap between graphics is removed in order to avoid duplicate calculation (step S12).

Subsequently, based on the pattern graphic areas calculated in step S12, a pattern-density data calculation part 13 calculates the area rates of graphic elements, i.e., pattern elements, contained in a unit region (step S13). For example, when a pattern element occupies one-half of the unit region that is a rectangular region of 100 µm square, the pattern density is 50%.

The unit region is a rectangular region corresponding to a one-mesh region for obtaining a two-dimensional distribution data of pattern densities. By an AND logic with the one-mesh region, an AND operation with the mesh region is executed so that the area of a pattern element is calculated and its pattern density is obtained. To the whole area of a single sub-chip, this calculation is performed to obtain a two-dimensional distribution data of pattern densities. Further, with respect to all the processes for a single sub-chip, this calculation is performed to obtain a two-dimensional distribution data of pattern densities in units of the processes of this sub-chip. This data is hereinafter referred to as "sub-chip pattern density data."

The processings in steps S11 to S13 are respectively executed to the inputted design data D1 about the plurality of sub-chips (the sub-chips A to N). In step S14, when the judgment result is that the pattern density data of all the processes of all the sub-chips are created, the pattern-density data generation device 10 outputs a pattern density data in units of the sub-chips D3. On the other hand, when any non-processed sub-chip remains, the processings of steps S11 to S13 are executed.

A-2. Operation and Effect

The design data of an LSI is tremendous and therefore stored by using a hierarchical structure. In some cases, the hierarchical structure is expanded to perform data processing. At this time, an unintentional expansion makes an intermediate file and using memory too large and the limit of hardware is exceeded, failing to perform the succeeding processing.

With the use of the pattern-density data generation device of the first preferred embodiment, the design data of sub-chips can be converted, in units sub-chips, to smaller pattern density data, thereby facilitating the handling of a large-scale data for designing the LSI.

B. Second Preferred Embodiment

The foregoing first preferred embodiment is directed to the pattern-density data creating method and generation device for obtaining the pattern density data per sub-chip. In order that the obtained pattern density data are used for evaluation and analysis of a variety of physical phenomena, the pattern density data in units of sub-chips are preferably synthesized to obtain a pattern density data in units of processes.

Followings are a pattern density data synthesizing method and a pattern-density data conversion device used in a mask data processing method and a mask data processor according to a second preferred embodiment of the present invention.

B-1. Pattern-Density Data Synthesizing Method

A pattern-density data synthesizing method will be described with reference to the configuration of a pattern-density data conversion device 20 in FIG. 4 and by using the flowchart in FIG. 3.

Figure 2:
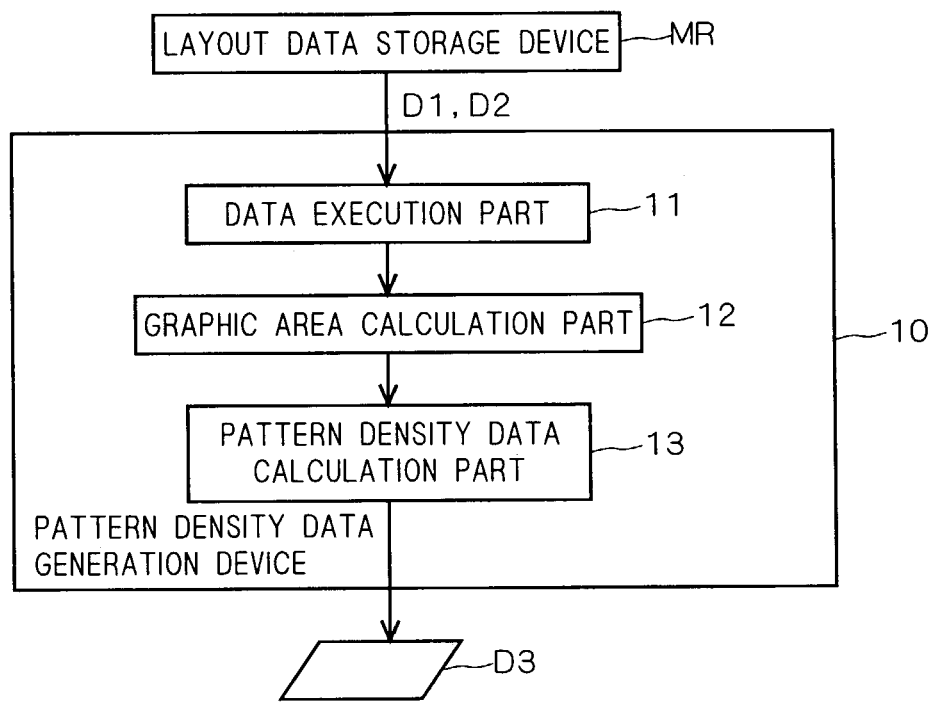
FIG. 2 is a block diagram to explain the configuration of a pattern-density data generation device in the first preferred embodiment.
Figure 3:
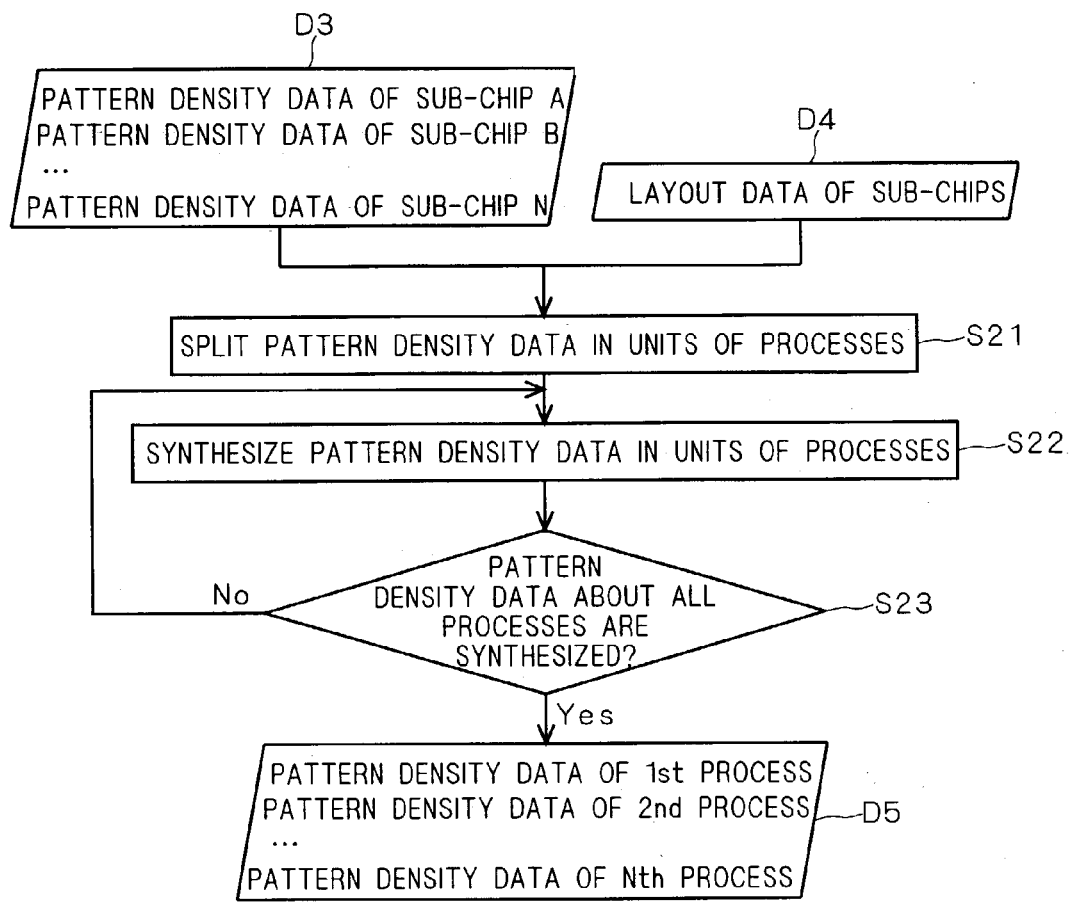
FIG. 3 is a flowchart to explain a pattern density data synthesizing method according to a second preferred embodiment of the present invention.

Referring to FIG. 3, a pattern density data is converted based on the pattern density data in units of sub-chips D3, which is created by the pattern-density data generation device 10 shown in FIG. 2, and layout data in units of sub-chips D4.

Specifically, when the pattern-density data generation device 10 and layout data storage device MR input the pattern density data D3 and layout data D4, respectively, to the pattern-density data conversion device 20, a pattern-density data split part 21 splits the individual sub-chip pattern density data into pattern density data in units of processes (step S21).

A file of the pattern density data of the individual sub-chips collectively stores the pattern density data of all the processes necessary for forming these sub-chips. The processing of step S21 is to split the pattern density data in this file in units of sub-chips and fetch the split data.

Figures 5, 6:
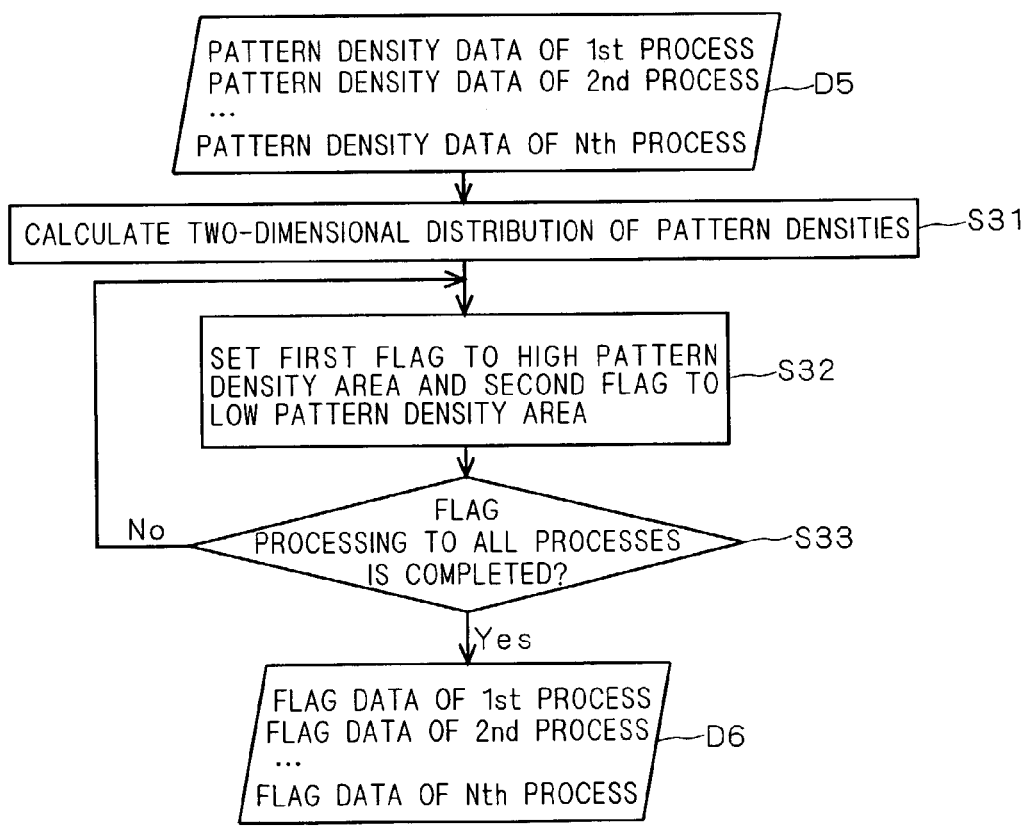
FIG. 5 is a diagram schematically illustrating the state that a pattern density data is split in units of processes.
FIG. 6 is a flowchart to explain a method of processing a two-dimensional distribution of pattern densities according to a third preferred embodiment.

The state that the pattern density data are split in units of processes is illustrated schematically in FIG. 5.

Referring to FIG. 5, with respect to the sub-chips A to N, pattern density data of the first to Nth processes are sequentially arranged in a matrix.

The sub-chip layout data D4 also contains offset data of the individual sub-chips. The processing for adding offset data to the pattern density data in units of processes is also performed in step S21.

That is, the offset data in units of sub-chips is data of lengths to be added to the coordinates of a pattern graphic data in order to avoid any overlap among a plurality of sub-chips to be formed on a semiconductor substrate.

For example, in order that a second sub-chip is spacedly disposed adjacent to a first sub-chip, data about the length of the first sub-chip in the direction that coincides with the array direction of the first and second sub-chips is added as offset data to a coordinate of a pattern graphic data in the second sub-chip.

Likewise, in order that a third sub-chip is spacedly disposed adjacent to the second sub-chip (on the opposite side of the first sub-chip), data about the sum of the lengths of the first and second sub-chips in the direction that coincides with the array direction of the first and second sub-chips is added as offset data to a coordinate of a pattern graphic data in the third sub-chip.

Subsequently, in a pattern-density data synthesizing part 22, the pattern density data split in units of processes are synthesized in units of processes common to the sub-chips (step S22).

This processing is to synthesize and output, for example, the pattern density data of the respective first processes of the sub-chips A to N. This data is hereinafter referred to as "first-process pattern density data." This is true for the second to Nth processes. The processing of step S22 is performed to all the processes. When the judgment result of step S23 is that the pattern density data of all the processes are synthesized, the pattern-density data conversion device 20 outputs pattern density data in units of processes D5. On the other hand, when any non-processed process remains, the processing of step S22 is executed.

B-2. Operation and Effect

With the use of the pattern-density data conversion device and synthesizing method of the second preferred embodiment, the pattern density data in units of processes D5 is obtainable. Consider now the pattern density data of a certain process, this data is a two-dimensional distribution data about the whole area of a transfer mask. The use of this two-dimensional distribution data permits simulation and evaluation of the microloading effect etc. in the CMP process and dry etching process.

Specifically, the microloading effect in the CMP process and dry etching process (i.e., the phenomenon that when patterns of the same size exist in different densities, polish velocity and etching rate differ depending on the location) has an extremely long correlation distance in physical phenomenon, as long as 10 μm to 100 μm, in some cases. It is known that damage to a certain portion due to the microloading effect in one sub-chip exerts an undesirable influence on other sub-chip.

Conventionally, design data and pattern density distribution data have merely been managed per sub-chip, and data throughout the entire transfer mask is not available in the absence of such a system for managing a plurality of sub-chips as in the first or second preferred embodiment of the present invention.

It is therefore impossible to take a full view of the transfer mask, failing to evaluate any process involving a physical phenomenon having an extremely long correlation distance. On the other hand, the use of the pattern-density data conversion device of the second preferred embodiment provides the two-dimensional distribution data of pattern densities in units of processes throughout the entire transfer mask. Therefore, any process involving physical phenomenon having an extremely long correlation distance can be evaluated by obtaining a two-dimensional distribution image of pattern densities based on this two-dimensional distribution data.

C. Third Preferred Embodiment

As described above, the two-dimensional distribution image of pattern densities capable of taking a full view of a transfer mask can be displayed by using the pattern density data in units of processes D5 that is obtainable with the pattern-density data synthesizing method of the second preferred embodiment. To accomplish this, it is necessary to convert the pattern density data D5 to the two-dimensional distribution image.

Followings are a method of processing a two-dimensional distribution of pattern densities and a processor used in a mask data processing method and mask data processor according a third preferred embodiment of the present invention.

C-1. Method of Processing Two-Dimensional Distribution of Pattern Densities

The method of processing a two-dimensional distribution of pattern densities will be described with reference to the configuration of a two-dimensional distribution processor 30 in FIG. 7 and by using the flowchart in FIG. 6.

Figure 4:
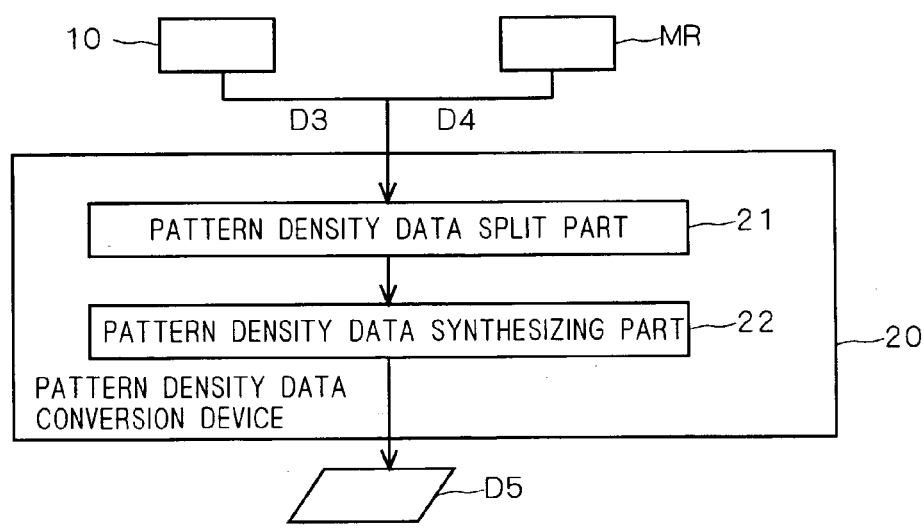
FIG. 4 is a block diagram to explain the configuration of a pattern-density data conversion device in the second preferred embodiment.

Referring to FIG. 7, the pattern density data in units of processes D5 created by the pattern-density data conversion device 20 shown in FIG. 4 is inputted to the two-dimensional distribution processor 30. Based on coordinate data contained in the data D5, a pattern-density two-dimensional distribution calculation part 31 expands the pattern density data D5 to two-dimension and obtains a two-dimensional distribution image of pattern densities in units of processes DP (step S31).

The processing of step S31 is illustrated schematically in FIG. 8.

Referring to FIG. 8, the storage locations of the pattern density data D5 of sub-chips A to N are respectively designated by X1 to Xn coordinates and Y1 to Ym coordinates, wherein n=m, and the individual coordinates contain different coordinate data.

For example, the pattern density stored at the location designated by coordinate X1 and Y1 is represented by Q11, and it will thus be seen that the pattern density data D5 is a mere data table.

The two-dimensional distribution image of pattern densities DP is obtainable by a two-dimensional display of the pattern density distributions of the sub-chips A to N, based on this data table.

Since the coordinate data of the sub-chips A to N contain the offset data as described in the second preferred embodiment, the locations of the sub-chips A to N are to be determined uniquely.

Although the sub-chips A to N are aligned in a row, this layout is cited merely by way of example and without limitation.

Returning to FIG. 6, when the calculation of the two-dimensional distributions of pattern densities is completed, a flag data creation part 32 sets a flag to the two-dimensional distribution image of pattern densities DP, based on a preset threshold value of pattern density.

Specifically, presetting upper and lower limit values in pattern density, the pattern density of each coordinate in the two-dimensional distribution image of pattern densities DP obtained in step S31 is compared with the upper and lower limit values, and the result is outputted as flag data by setting the following flags (step S32). For example, above the upper limit value, the pattern density is high and a first flag is set. Below the lower limit value, the pattern density is low and a second flag is set.

The upper and lower limit values in pattern density may be inputted as an external parameter to the two-dimensional distribution processor 30. For example, in the dry etching process, due to microloading effect, the finish dimension of etching varies depending on the pattern density. Therefore, the behavior of such dimensional change may be searched to determine and input the upper and lower limit values in pattern density such that the amount of dimensional change is not more than a permissible value.

For sake of simplicity, the following method may be employed. That is, a mean value of all the pattern densities of the sub-chips A to N is calculated, and upper and lower limit values are set based on a deviation from the mean value.

The processing of step S32 is executed to the entire first to Nth processes. If the judgment result of step S33 is that the flag processing has been executed to all the processes, the two-dimensional distribution processor 30 outputs flag data of the individual processes D6. On the other hand, if any non-processed process remains, the processing of step S32 is executed.

C-2. Operation and Effect

As described above, by using the two-dimensional distribution processing method and the processor in the third preferred embodiment, the two-dimensional distribution image of pattern densities capable of taking a full view of a transfer mask can be displayed and a singular point in the two-dimensional distribution image of pattern densities can be visualized, facilitating the evaluation and analysis of various physical phenomena. In addition, modification and correction to design data are facilitated by setting a flag to the two-dimensional distribution image based on the preset threshold value in pattern density.

D. Fourth Preferred Embodiment

The foregoing third preferred embodiment is directed to the configuration of setting a flag to the two-dimensional distribution image of pattern densities, based on the threshold value in pattern density. The following configuration may be employed from the point of view of visualizing a singular point in the two-dimensional distribution image of pattern densities.

Followings are a method of processing a two-dimensional distribution of pattern densities and a processor used in a mask data processing method and mask data processor according to a fourth preferred embodiment of the present invention.

D-1. Method of Processing Two-Dimensional Distribution of Pattern Densities

Figure 9:
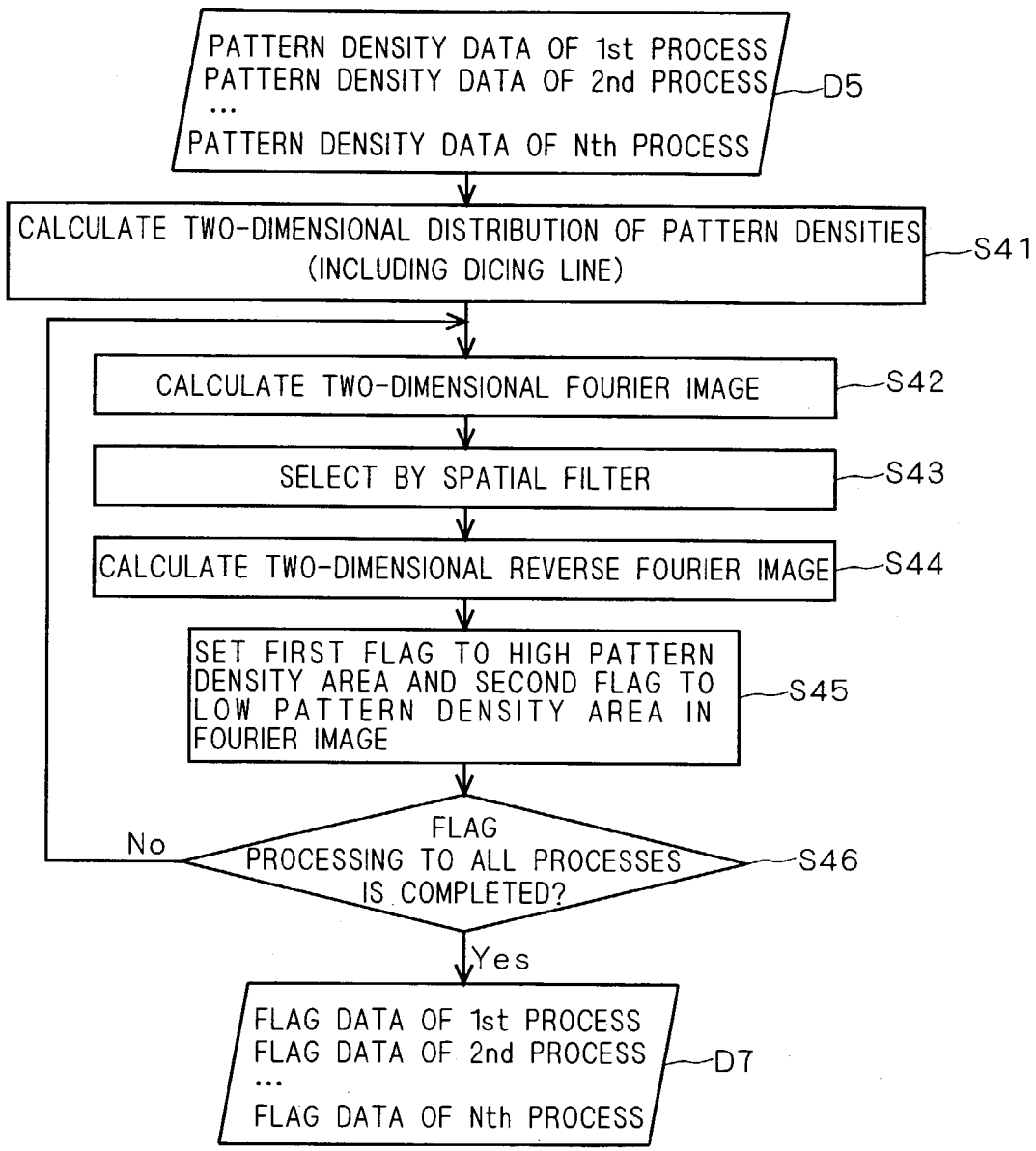
FIG. 9 is a flowchart to explain a method of processing a two-dimensional distribution of pattern densities according to a fourth preferred embodiment of the present invention.

The method of processing a two-dimensional distribution of pattern densities will be described with reference to the configuration of a two-dimensional distribution processor 40 in FIG. 10 and by using the flowchart in FIG. 9.

Referring to FIG. 10, the pattern density data in units of processes D5 created by the pattern-density data conversion device 20 shown in FIG. 4 is inputted to the two-dimensional distribution processor 40. Then, a pattern-density two-dimensional distribution calculation part 41 stores the pattern density data D5 in the corresponding coordinate of a two-dimensional array and obtains a two-dimensional distribution image of pattern densities in units of processes DP (step S41). At this time, coordinate data about a blank portion corresponding to a dicing line is also introduced, thereby permitting an evaluation taking cyclic boundary condition into consideration, as will be described later. The processing of step S41 is the same as the processing of step S31 described with reference to FIG. 8, and its description is therefore omitted.

After calculating the two-dimensional distribution of pattern densities, a Fourier calculation part 42 performs Fourier transform of the two-dimensional distribution image of pattern densities DP and calculates a two-dimensional Fourier image. By this Fourier transform, projection from the real space to frequency space is produced so that the two-dimensional image in the real space is converted to a two-dimensional Fourier image represented by the magnitude of space frequencies (step S42).

Concretely, a component having a small space frequency corresponds to a region in the real space where many isolated patterns are present, and a component having a large space frequency corresponds to a region in the real space where many dense patterns are present.

Subsequently, a spatial filter part 43 subjects the two-dimensional Fourier image to a spatial filtering that permits only passage of components having a small space frequency. As the result, the components of small space frequency are selected and components of large space frequency are removed (step S43). The technique of spatial filtering is well known.

Here, the component having a small space frequency corresponds to a component that is a factor contributing to the phenomenon having a long correlation distance (microloading effect etc.). The component having a long space frequency corresponds to a component that is a factor contributing to the phenomenon having a short correlation distance.

Therefore, the spatial filtering removes the components of large space frequency, leaving the components of small space frequency, i.e., the components that is the factor contributing to the phenomenon having a long correlation distance.

Subsequently, a reverse Fourier calculation part 44 performs a reverse Fourier transform of the two-dimensional Fourier image holding only the components of small spatial frequency, thereby obtaining a reverse Fourier image, i.e., a two-dimensional distribution image of pattern densities in the real space (step S44).

In the resulting two-dimensional distribution image of pattern densities, there is displayed only the components as the factor contributing to the phenomenon having a long correlation distance. That is, this image is suitable for analyzing the phenomenon having a long correlation distance.

Subsequently, a flag data creation part 45 sets a flag to the two-dimensional distribution image of pattern densities obtained in step S44, based on a preset threshold value in pattern density.

Specifically, presetting upper and lower limit values in pattern density, the pattern densities of each coordinate in the two-dimensional distribution image of pattern density obtained in step S44 is compared with the upper and lower limit values, and the result is outputted as flag data by setting the following flags (step S45). For example, above the upper limit value, the pattern density is high and a first flag is set. Below the lower limit value, the pattern density is low and a second flag is set.

The upper and lower limit values in pattern density may be inputted as an external parameter to the two-dimensional distribution processor 40. For example, if in the dry etching process, due to microloading effect, the finish dimension of the etching varies depending on the pattern density, the behavior of such dimensional change may be searched to determine and input the upper and lower limit values in pattern density such that the amount of dimensional change is not more than a permissible value.

For sake of simplicity, the following method may be employed. That is, a mean value of all the pattern densities of the sub-chips A to N is calculated, and upper and lower limit values are set based on a deviation from the mean value.

The processings of steps S42 to S45 are executed to all the first to Nth processes. If the judgment result of step S46 is that the flag processing has been executed to all the processes, the two-dimensional distribution processor 40 outputs flag data D7 about the respective processes. If any non-processed process remains, the processings of steps S42 to S45 are executed.

D-2. Operation and Effect

As described above, the two-dimensional distribution image of pattern densities capable of taking a full view of a transfer mask, in particular, the two-dimensional distribution image showing only the components that are factors contributing to the phenomenon having a long correlation distance, can be displayed by using the processor and processing method of the two-dimensional distribution of pattern densities in the fourth preferred embodiment. This enables to visualize a singular point in the two-dimensional distribution image of pattern densities and facilitates evaluations and analyses of various physical phenomena. In addition, modification and correction to design data are executable by setting a flag to this two-dimensional distribution image based on the preset threshold value in pattern density.

Further, the execution of Fourier transform to the two-dimensional distribution image of pattern densities DP in step S42 will automatically result in the introduction of cyclic boundary condition. That is, it is calculated that in the reverse Fourier image (i.e., the real spatial image), sub-chips are continuously disposed at spatial intervals in such a fashion that the left end of one sub-chip is present on the right side of the right end of other sub-chip. The introduction of the coordinate data about the blank portion corresponding to the dicing line in step S41 is to introduce such cyclic boundary condition.

Also on an actual semiconductor substrate, a plurality of sub-chips are arrayed by repeating exposure shot with the use of the same transfer mask while displacing the transfer mask such that a first exposure shot is adjacent to a second exposure shot. Therefore, the introduction of the above-mentioned cyclic boundary condition permits an analysis that highly matches an actual wafer process, thus leading to a high accuracy evaluation even when a process has such a long correlation distance as extending to the whole semiconductor substrate.

E. Fifth Preferred Embodiment

The third and fourth preferred embodiments are directed to the configuration of visualizing a singular point in the two-dimensional distribution image of pattern densities. Any matter other than pattern density may be visualized as follows.

E-1. Method of Processing Two-Dimensional Distribution of Pattern Densities

Figure 11:
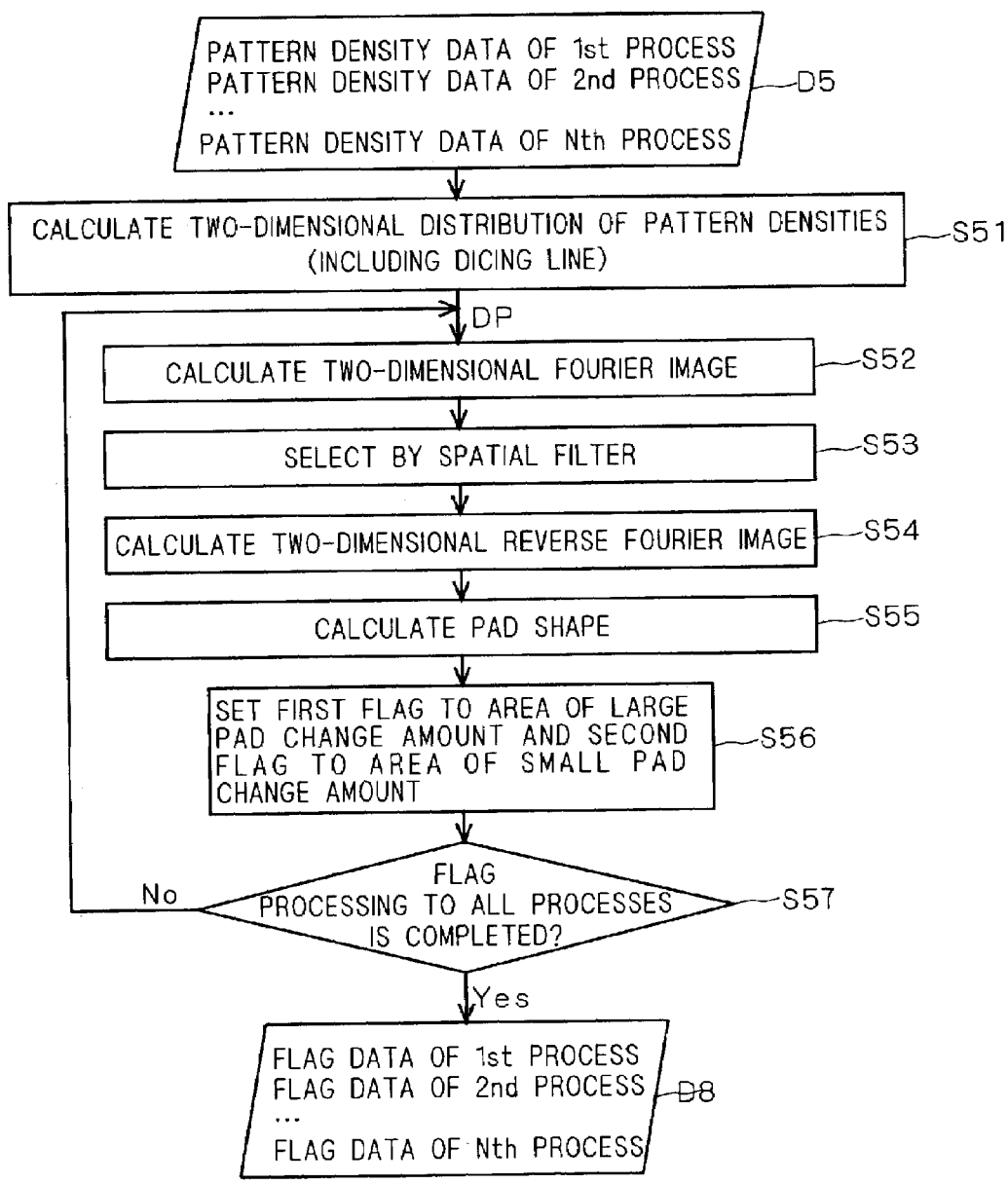
FIG. 11 is a flowchart to explain a method of processing a two-dimensional distribution of pattern densities according to a fifth preferred embodiment of the present invention.

The method of processing two-dimensional distribution of pattern densities will be described with reference to the configuration of a two-dimensional distribution processor 50 in FIG. 12 and by using the flowchart in FIG. 11.

Figure 12:
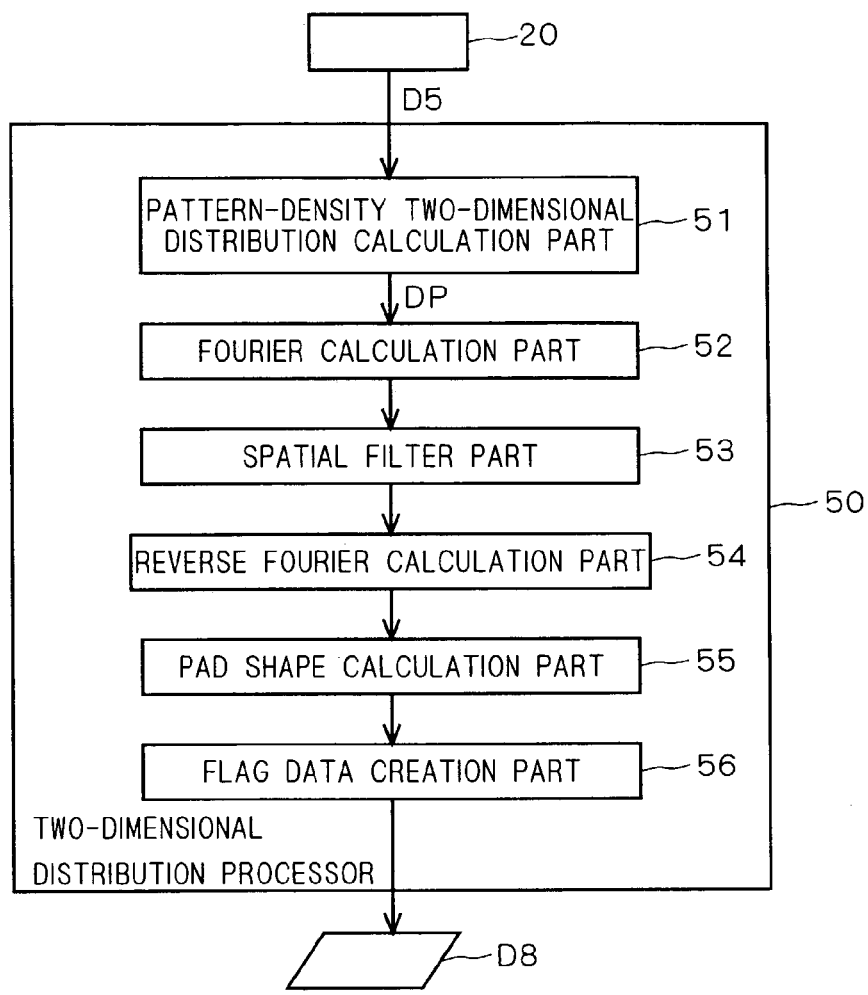
FIG. 12 is a block diagram to explain a two-dimensional distribution processor in the fifth preferred embodiment.

Referring to FIG. 12, the pattern density data in units of processes D5 created by the pattern-density data conversion device 20 shown in FIG. 4 is inputted to the two-dimensional distribution processor 50. Then, a pattern density two-dimensional distribution calculation part 51 stores the pattern density data D5 in the corresponding coordinate of a two-dimensional array and obtains a two-dimensional distribution image of pattern densities in units of processes DP (step S51). At this time, coordinate data about a blank portion corresponding to a dicing line is also introduced, thereby permitting an evaluation taking the cyclic boundary condition into consideration. The processing of step S51 is the same as the processing of step S31 described with reference to FIG. 8, and its description is therefore omitted.

After calculating the two-dimensional distribution of pattern densities, a Fourier calculation part 52 executes Fourier transform of the two-dimensional distribution image of pattern densities DP and calculates a two-dimensional Fourier image. By this Fourier transform, projection from the real space to frequency space is produced so that the two-dimensional image in the real space is converted to a two-dimensional Fourier image represented by the magnitude of space frequencies (step S52).

Subsequently, a spatial filter part 53 subjects the two-dimensional Fourier image to a spatial filtering that permits only passage of components having a small space frequency. As the result, the components of small space frequency are selected and components of large space frequency are removed (step S53).

Thereafter, a reverse Fourier calculation part 54 performs a reverse Fourier transform of the two-dimensional Fourier image holding only the components of small spatial frequency, thereby obtaining a reverse Fourier image, i.e., a two-dimensional distribution image of pattern densities in the real space (step S54).

In the resulting two-dimensional distribution image of pattern densities, there is displayed only the components as the factor contributing to the phenomenon having a long correlation distance. That is, this image is suitable for analyzing the phenomenon having a long correlation distance.

Subsequently, a pad shape calculation part 55 calculates a two-dimensional distribution image of the irregularities of a polishing pad used in CMP, by using pattern density data and mechanical parameters such as Young's modulus and elastic coefficients of the polishing pad used in the CMP (step S55).

This processing is a preprocessing for finding a height distribution of the finished surface after polishing by the CMP, and also one of the processes for analyzing the influence of the CMP process having a long correlation distance.

To calculate the shape of the polishing pad irregularities, it is firstly required to find a height distribution of the processing surface before the CMP. This height distribution is obtainable from a two-dimensional distribution of pattern densities.

Here, the relationship between the pattern density and the height of irregularities on the finished surface will be schematically explained with reference to FIGS. 13 and 14.

Figure 13:
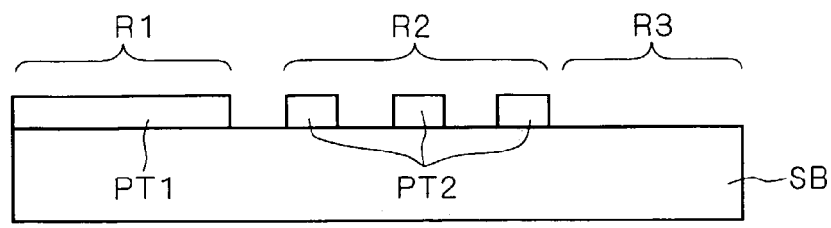
FIGS. 13 and 14 are diagrams to illustrate schematically the relationship between pattern density and the height of irregularities on a finished surface.

FIG. 13 shows the state that already fabricated circuit pattern PT and plurality of circuit patterns PT2 are arrayed on a semiconductor substrate SB. In FIG. 13, the region where the circuit pattern P1 is disposed is represented by region R1; the region where the plurality of circuit patterns PT2 are disposed is represented by region R2; and the region where no circuit patter is disposed is represented by region R3.

In the region R1, the circuit pattern PT1 is formed so as to cover the entire region and its pattern density, i.e., its pattern density, is 100%. In the region R2, a 50% of its entire region is covered with the circuit patterns PT2, and its pattern density is 50%. The pattern density of the region R3 is 0%.

In the manufacturing processes of an LSI, the process of forming an insulating film and metal film and the process of patterning these films are repetitively performed. Therefore, the insulating film and metal film (hereinafter referred to as a "laminating film") are to be formed on an already fabricated circuit pattern. When forming the laminating film, the material of the laminating film per unit area is supplied nearly uniformly throughout the entire semiconductor substrate surface.

Figure 14:
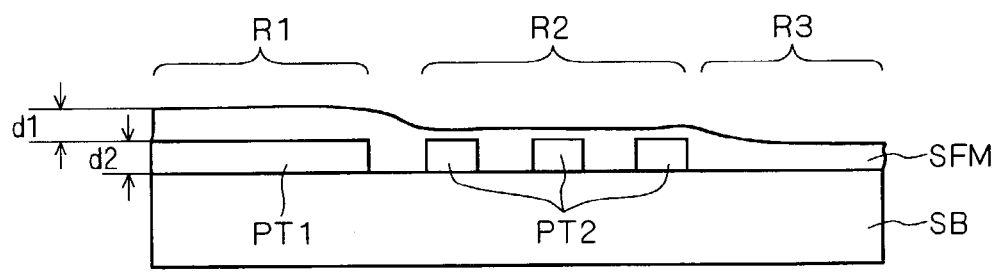

FIG. 14 shows the state that the laminating film SFM is formed on the semiconductor substrate SB, and a height distribution occurs in the laminating film SFM due to a difference in pattern density between the circuit patterns.

Let, d1 is the formation thickness of the laminating film SFM, and d2 is the thickness of the circuit pattern PT1 or PT2. In the region R1 having a pattern density of 100%, the total height H1 of the laminating film SFM and circuit pattern PT1 is given by the following expression: $H1=d1+d2\times1.0$. In the region R2 having a pattern density of 50%, because reflow and annealing processing fill grooves and planarization is facilitated (the planarization effect during the film formation), the total height H2 of the laminating film SFM and circuit pattern PT2 is given by the following expression: $H2=d1+d2\times0.5$. In the region R3 having a pattern density of 0%, the total height H3 of the laminating film SFM and circuit pattern PT2 is given by the following expression: $H3=d1+d2\times0$. In the above three expressions, the factors "1.0", "0.5", and "0" are pattern densities.

Since the formation thickness d1 of the laminating film SFM is common to all the regions, it is relatively meaningless and can be eliminated. Accordingly, the height of each region can be given by the expression: $d2\times$(pattern density).

The thickness d2 of the circuit pattern PT1 or PT2 is a process parameter that varies depending on the type of pattern. The height distribution of the laminating film SFM can be made uniform by controlling the circuit patterns such that the pattern density distribution is uniform.

Therefore, the pad shape calculation part 55 can obtain a height distribution of the processing surface before CMP by executing such a simple arithmetic of multiplying the two-dimensional distribution of pattern densities obtained in step S54, by the thickness of a laminating film to be formed in the following next process.

Subsequently, a two-dimensional distribution of irregularities when the polishing pad is pressed against the processing surface before CMP is calculated based on the obtained height distribution of the processing surface before CMP.

Figure 15:
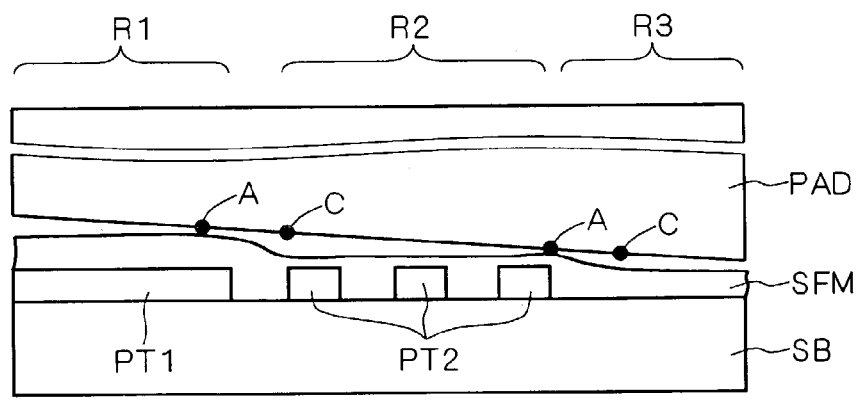
FIG. 15 is a diagram to illustrate schematically the state that a polishing pad is pressed against a processing surface before CMP.

The state that the polishing pad PAD is pressed against the processing surface before CMP is illustrated schematically in FIG. 15.

Referring to FIG. 15, when the polishing pad PAD is pressed against the processing surface, a characteristic phenomenon occurs at the boundary portions between the regions R1 and R2 and that between the regions R2 and R3. Specifically, the polishing pad PAD is brought into contact with the laminating film SFM at locations indicated by character "A" in these boundary portions, so that these locations are subjected to large stress and the laminating film SFM is well polished. On the other hand, at locations indicated by character "C", the polishing pad PAD is away from the laminating film SFM and these locations are subjected to less stress, resulting in poor polishing to the laminating film SFM.

The height distribution of the laminating film SFM, i.e., the shape of the laminating film SFM, is given by the product of the two-dimensional distribution of pattern densities obtained in step S54 and the thickness d2 of the circuit pattern PT1 or PT2. The two-dimensional distribution image of the polishing pad PAD is given by the product of the reverse Fourier image and the thickness d2.

Returning to FIG. 11, after calculating the two-dimensional distribution image of the irregularities of the polishing pad, a flag data creation part 56 sets a flag to this distribution image based on a preset threshold value of the pad change amount.

Specifically, presetting upper and lower limit values in the pad change amount, the pad change amounts at the individual coordinates in the two-dimensional distribution image of the polishing pad irregularities obtained in step S55 is compared with the upper and lower limit values, and the result is outputted as flag data by setting the following flags (step S56). For example, above the upper limit value, the change amount is large and a first flag is set. Below the lower limit value, the change amount is small and a second flag is set.

The upper and lower limit values in the pad change amount may be inputted as an external parameter to the two-dimensional distribution processor 50. For sake of simplicity, the following method may be employed. That is, a mean value of all the pad change amounts in the sub-chips A to N is calculated, and upper and lower limit values are set based on a deviation from the mean value.

The processings of steps S52 to S56 are executed to the entire first to the Nth processes. If the judgment result of step S57 is that the flag processing has been executed to all the processes, the two-dimensional distribution processor 50 outputs flag data D8 about the respective processes. If any non-processed process remains, the processings of steps S52 to S56 are executed.

E-2. Operation and Effect

As described above, with the use of the two-dimensional distribution processor of pattern densities and the processing method in the fifth preferred embodiment, it is possible to display the two-dimensional distribution image of pattern densities capable of taking a full view of a transfer mask, in particular, the two-dimensional distribution image of pattern densities showing only the components that are factors contributing to the phenomenon having a long correlation distance. It is therefore possible to obtain a two-dimensional distribution image suitable for analyzing the phenomenon having a long correlation distance.

Further, the execution of Fourier transform to the two-dimensional distribution image of pattern densities DP in step S52 will automatically result in the introduction of cyclic boundary condition. That is, it is calculated that in the reverse Fourier image (i.e., the real spatial image), sub-chips are continuously disposed at spatial intervals in such a fashion that the left end of one sub-chip is present on the right side of the right end of other sub-chip. The introduction of the coordinate data about the blank portion corresponding to the dicing line in step S51 is to introduce such cyclic boundary condition.

Also on an actual semiconductor substrate, a plurality of sub-chips are arrayed by repeating exposure shot with the use of the same transfer mask while displacing the transfer mask such that a first exposure shot is adjacent to a second exposure shot. Therefore, the introduction of the above-mentioned cyclic boundary condition permits an analysis that highly matches an actual wafer process, thus leading to a high accuracy evaluation even when a process has such a long correlation distance as extending to the whole semiconductor substrate.

Further, the visualization of a singular point in the two-dimensional distribution image of the polishing pad irregularities facilitates evaluation and analysis taking into consideration the influences due to the physical factors such as the shape, material, and revolution of the pad in the CMP process.

Furthermore, modification and correction to design data are possible by performing in step S55 the processes of finding the two-dimensional distribution image of the polishing pad irregularities, and setting a flag to this two-dimensional distribution image based on the preset threshold value of the pad change amount.

F. Sixth Preferred Embodiment

Without limiting to pattern densities, the two-dimensional distribution image for visualizing a singular point may have the following configuration.

F-1. Method of Processing Two-Dimensional Distribution of Pattern Densities

Figure 16:
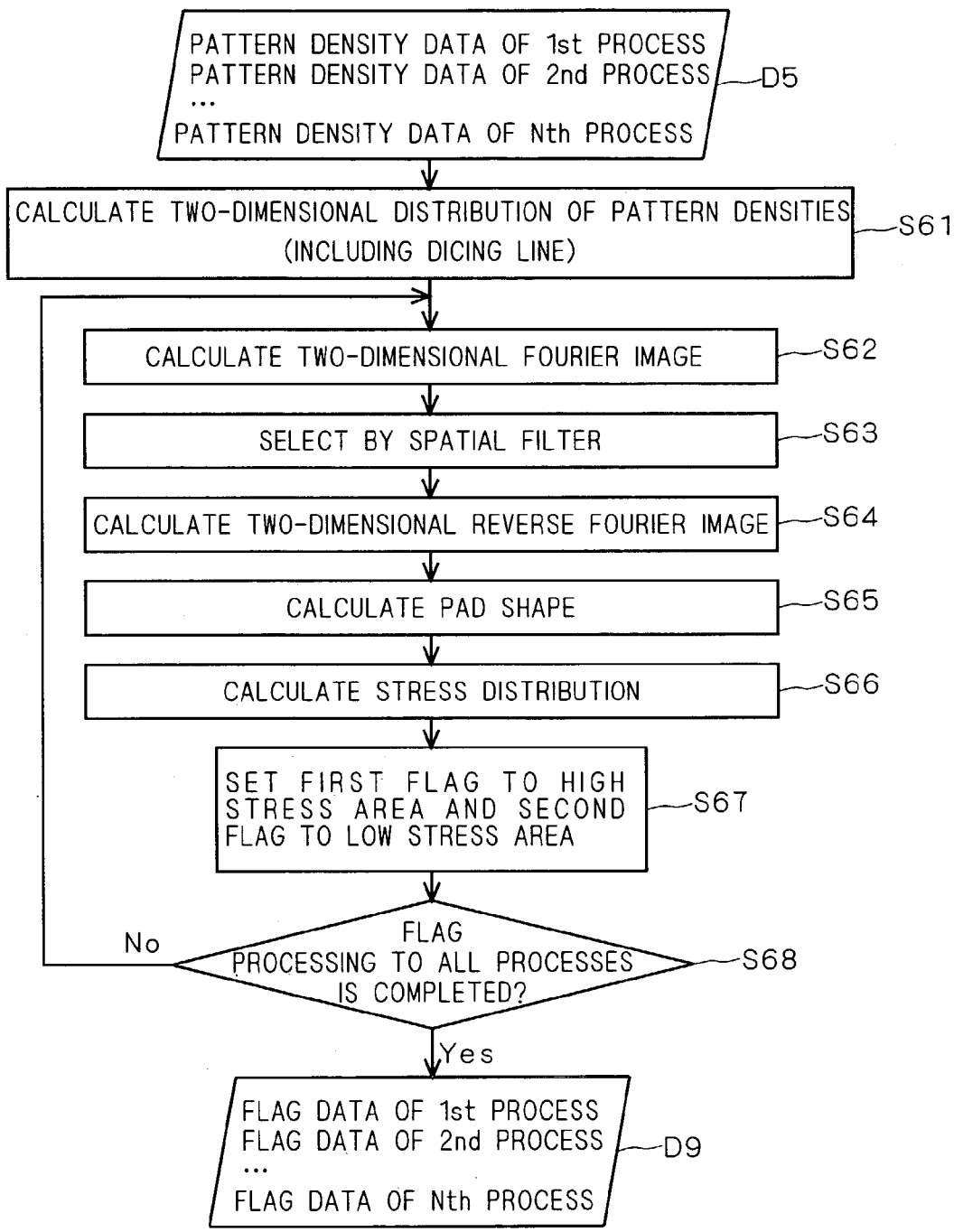
FIG. 16 is a flowchart to explain a method of processing a two-dimensional distribution of pattern densities according to a sixth preferred embodiment of the present invention.

The method of processing a two-dimensional distribution of pattern densities will be described with reference to the configuration of a two-dimensional distribution processor 60 in FIG. 17 and by using the flowchart in FIG. 16.

Figure 17:
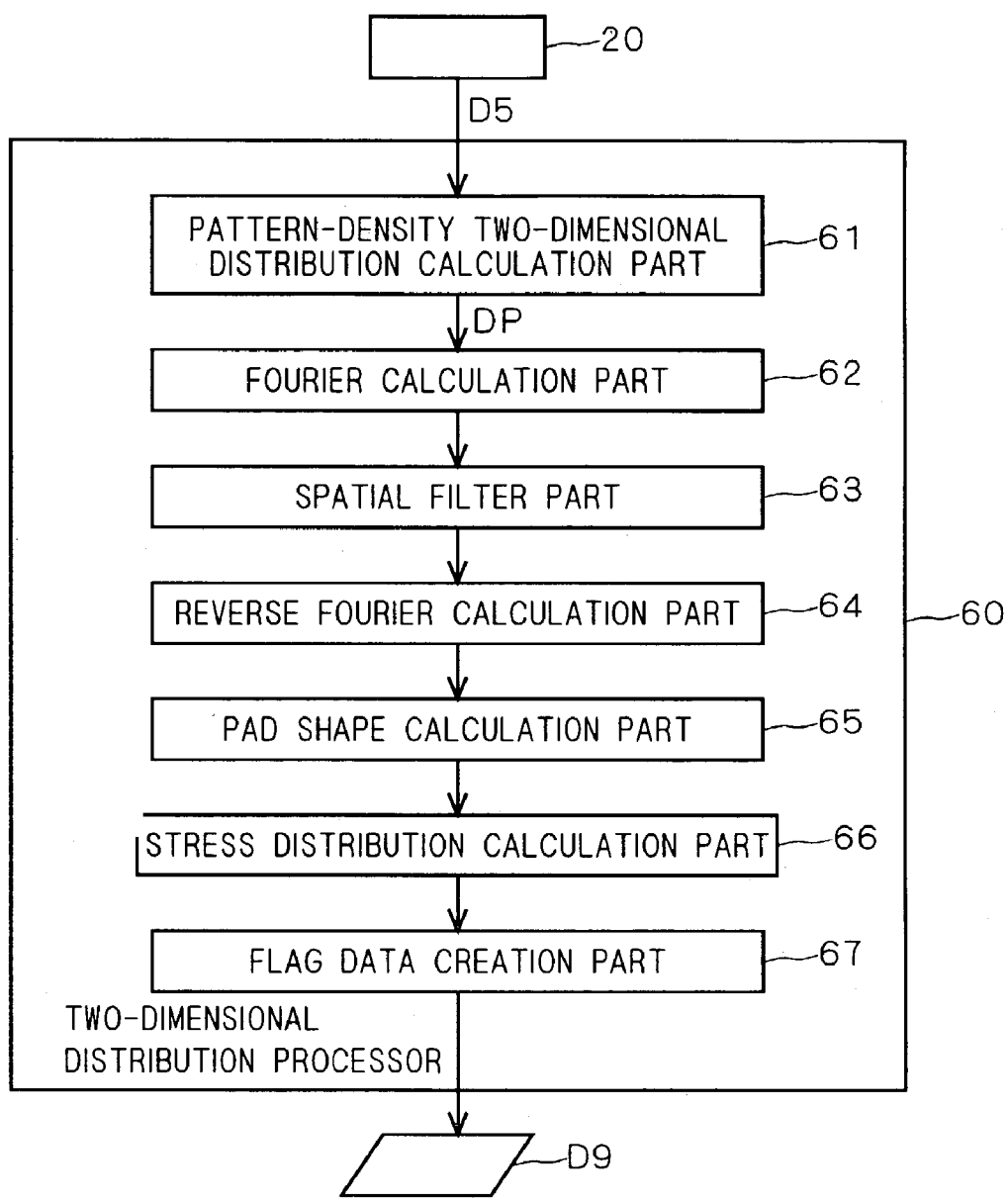
FIG. 17 is a block diagram to explain a two-dimensional distribution processor in the sixth preferred embodiment.

Referring to FIG. 17, the pattern density data in units of processes D5 created by the pattern-density data conversion device 20 shown in FIG. 4 is inputted to the two-dimensional distribution processor 60. Then, a pattern-density two-dimensional distribution calculation part 61 stores the pattern density data D5 in the corresponding coordinate of a two-dimensional array and obtains a two-dimensional distribution image of pattern densities in units of processes (step S61). At this time, coordinate data about a blank portion corresponding to a dicing line is also introduced, thereby permitting an evaluation taking the cyclic boundary condition into consideration. The processing of step S61 is the same as the processing of step S31 described with reference to FIG. 8, and its description is therefore omitted.

After calculating the two-dimensional distribution of pattern densities, a Fourier calculation part 62 executes Fourier transform of the two-dimensional distribution image of pattern densities DP and calculates a two-dimensional Fourier image. By this Fourier transform, projection from the real space to frequency space is produced so that the two-dimensional image in the real space is converted to a two-dimensional Fourier image represented by the magnitude of space frequencies (step S62).

Subsequently, a spatial filter part 63 subjects the two-dimensional Fourier image to a spatial filtering that permits only passage of components having a small space frequency. As the result, the components of small space frequency are selected and components of large space frequency are removed (step S63).

Then, a reverse Fourier calculation part 64 performs a reverse Fourier transform of the two-dimensional Fourier image holding only the components of small spatial frequency, thereby obtaining a reverse Fourier image, i.e., a two-dimensional distribution image of pattern densities in the real space (step S64).

Subsequently, a pad shape calculation part 65 calculates a two-dimensional distribution image of the irregularities of a polishing pad used in CMP, by using pattern density data and mechanical parameters such as Young's modulus and elastic coefficients of the polishing pad used in the CMP (step S65). This processing is a preprocessing for finding a height distribution of the finished surface after polishing by the CMP, and also one of the processes for analyzing the influence of the CMP process having a long correlation distance.

The processing of step S65 is the same as that described in the fifth preferred embodiment with reference to FIGS. 13 to 15, and its description is omitted here.

Subsequently, a stress distribution calculation part 66 calculates a two-dimensional distribution of stress exerted on the polishing pad (step S66). The stress exerted on the polishing pad PAD will be described with reference to FIG. 15.

Referring again to FIG. 15, when the polishing pad PAD is pressed against the processing surface, a characteristic phenomenon occurs at boundary portions between the regions R1 and R2 and that between the regions R2 and R3. Specifically, the polishing pad PAD is brought into contact with the laminating film SFM at locations indicated by character "A" in these boundary portions, so that these locations are subjected to large stress and the laminating film SFM is well polished. On the other hand, at locations indicated by character "C", the polishing pad PAD is away from the laminating film SFM and these locations are subjected to less stress, resulting in poor polishing to the laminating film SFM.

Specifically, large stress is being exerted on the regions, such as the regions R1 and R2, where the change amount of the polishing pad PAD is large, and these regions are polished promptly. On the other hand, in a region free from any distortion such as the region R3, and in the case that distortion occurs in the opposite directions in a region between projected patterns, the stress is zero, making it difficult to polish these regions. Even in projected patterns of the same size, they will be subjected to different stresses and different polish velocity depending on whether there is any other projected pattern that supports adjacent to these projected patterns.

The stress distribution calculation part 66 calculates such stress that varies depending on the location of the polishing pad PAD, and calculates a two-dimensional distribution image of the stress.

A two-dimensional distribution image of the stress exerted on the polishing pad PAD can be found based on a difference between the shape of the laminating film SFM and the shape of the polishing pad PAD (i.e., the two-dimensional image of the irregularities), as described in the fifth preferred embodiment.

Specifically, the two-dimensional distribution image of the stress exerted on the polishing pad PAD is obtainable by multiplying a numeric value that is obtained by subtracting the numeric data of the shape of the polishing pad PAD from the numeric data of the shape of the laminating film SFM, by Young's modulus (elastic coefficients).

Returning to FIG. 16, after calculating the two-dimensional distribution image of the stress exerted on the polishing pad, a flag data creation part 67 sets a flag to this distribution image based on a preset threshold value of the stress value.

Specifically, presetting upper and lower limit values in the stress value exerted on the pad, the stress values at the individual coordinates in the two-dimensional distribution image of the stress exerted on the polishing pad obtained in step S66 is compared with the upper and lower limit values, and the result is outputted as flag data by setting the following flags (step S67). For example, above the upper limit value, the stress value is high and a first flag is set. Below the lower limit value, the stress value is low and a second flag is set.

The upper and lower limit values in the stress may be inputted as an external parameter to the two-dimensional distribution processor 60. For sake of simplicity, the following method may be employed. That is, a mean value of all the stress values in the sub-chips A to N is calculated, and upper and lower limit values are set based on a deviation from the mean value.

The processings of steps S62 to S67 are executed to the entire first to the Nth processes. If the judgment result of step S68 is that the flag processing has been executed to all the processes, the two-dimensional distribution processor 60 outputs flag data D9 about the respective processes. If any non-processed process remains, the processings of steps S62 to S67 are executed.

F-2. Operation and Effect

As described above, with the use of the processor of two-dimensional distribution of pattern densities and the processing method in the sixth preferred embodiment, it is possible to display the two-dimensional distribution image of pattern densities capable of taking a full view of a transfer mask, in particular, the two-dimensional distribution image of pattern density showing only the components that are factors contributing to the phenomenon having a long correlation distance. It is therefore possible to obtain a two-dimensional distribution image suitable for analyzing the phenomenon having a long correlation distance.

Further, the execution of Fourier transform to the two-dimensional distribution image of pattern densities DP in step S62 will automatically result in the introduction of cyclic boundary condition. That is, it is calculated that in the reverse Fourier image (i.e., the real spatial image), sub-chips are continuously disposed at spatial intervals in such a fashion that the left end of one sub-chip is present on the right side of the right end of other sub-chip. The introduction of the coordinate data about the blank portion corresponding to the dicing line in step S61 is to introduce such cyclic boundary condition.

Also on an actual semiconductor substrate, a plurality of sub-chips are arrayed by repeating exposure shot with the use of the same transfer mask while displacing the transfer mask such that a first exposure shot is adjacent to a second exposure shot. Therefore, the introduction of the above-mentioned cyclic boundary condition permits an analysis that highly matches an actual wafer process, thus leading to a high accuracy evaluation even when a process has such a long correlation distance as extending to the whole semiconductor substrate.

Further, a singular point in the two-dimensional distribution image of the stress exerted on the polishing pad can be visualized by performing in step S66 the processes of obtaining the two-dimensional distribution image of the stress exerted on the polishing pad and setting a flag to this two-dimensional distribution image based on the preset threshold value of the stress value. This visualization facilitates evaluation and analysis taking into consideration the influences due to the physical factors such as the shape, material, and revolution of the pad in the CMP process. Furthermore, the obtained stress distribution can be used to predict a location susceptible to any pattern defect during the CMP process. Setting a flag to the area subjected to excess stress facilitates data correction.

G. Seventh Preferred Embodiment

Without limiting to pattern densities, the two-dimensional distribution image for visualizing a singular point may have the following configuration.

G-1. Method of Processing Two-Dimensional Distribution of Pattern Densities

Figure 18:
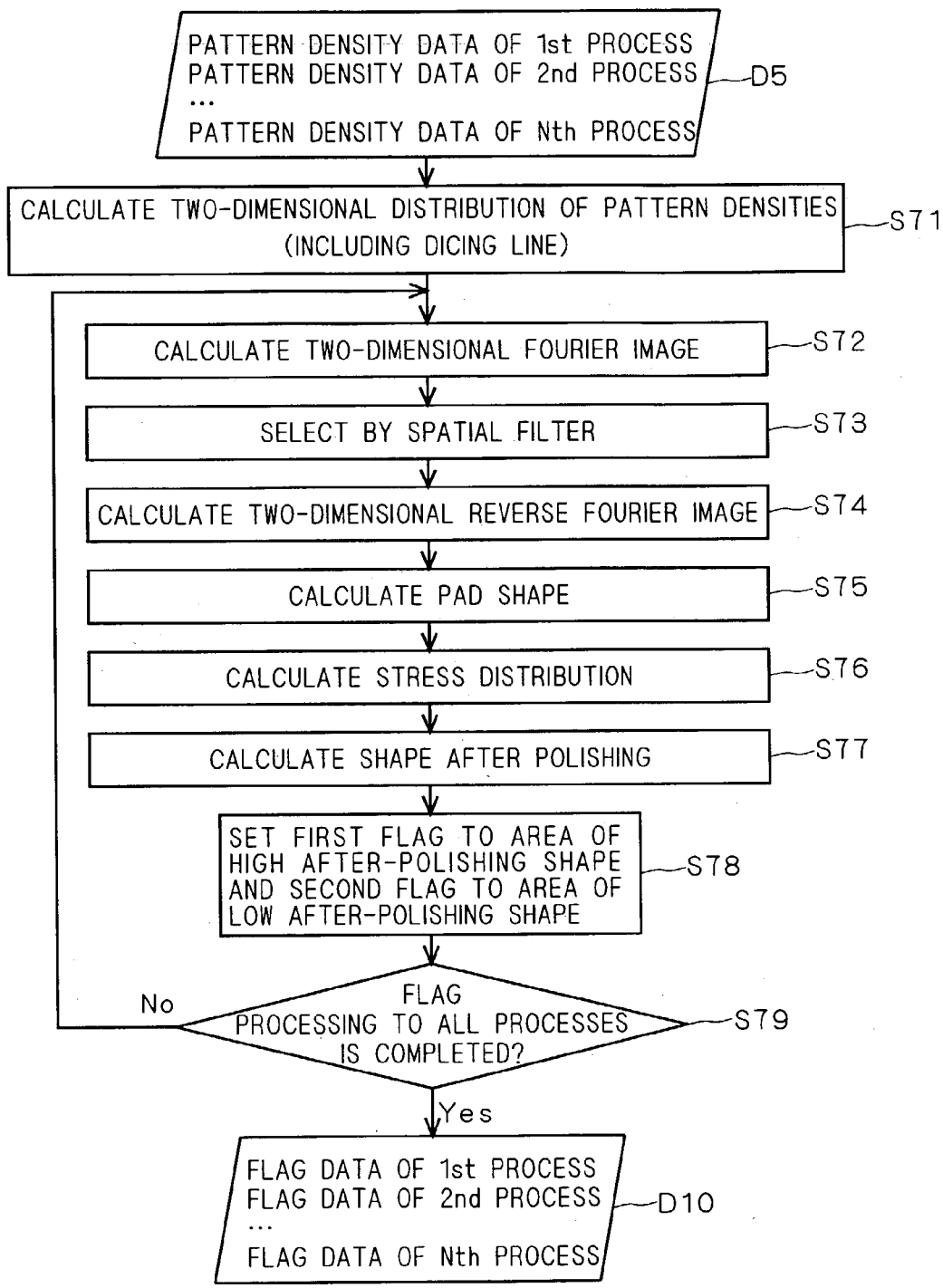
FIG. 18 is a flowchart to explain a method of processing a two-dimensional distribution of pattern densities according to a seventh preferred embodiment of the present invention.

The method of processing a two-dimensional distribution of pattern densities will be described with reference to the configuration of a two-dimensional distribution processor 70 in FIG. 19 and by using the flowchart in FIG. 18.

Referring to FIG. 19, the pattern density data in units of processes D5 created by the pattern-density data conversion device 20 shown in FIG. 4 is inputted to the two-dimensional distribution processor 70. Then, a pattern-density two-dimensional distribution calculation part 71 stores the pattern density data D5 at their corresponding coordinates in a two-dimensional array and obtains a two-dimensional distribution image of pattern densities in units of processes (step S71). At this time, coordinate data about a blank portion corresponding to a dicing line is also introduced, thereby permitting an evaluation taking the cyclic boundary condition into consideration. The processing of step S71 is the same as the processing of step S31 described with reference to FIG. 8, and its description is therefore omitted.

After calculating the two-dimensional distribution of pattern densities, a Fourier calculation part 72 executes Fourier transform of the two-dimensional distribution image of pattern densities DP and calculates a two-dimensional Fourier image. By this Fourier transform, projection from the real space to frequency space is produced so that the two-dimensional image in the real space is converted to a two-dimensional Fourier image represented by the magnitude of space frequencies (step S72).

Subsequently, a spatial filter part 73 subjects the two-dimensional Fourier image to a spatial filtering that permits only passage of components having a small space frequency. As the result, the components of small space frequency are selected and components of large space frequency are removed (step S73).

Then, a reverse Fourier calculation part 74 performs a reverse Fourier transform of the two-dimensional Fourier image holding only the components of small spatial frequency, thereby obtaining a reverse Fourier image, i.e., a two-dimensional distribution image of pattern densities in the real space (step S74).

Subsequently, a pad shape calculation part 75 calculates a two-dimensional distribution image of the irregularities of a polishing pad used in CMP, by using pattern density data and mechanical parameters such as Young's modulus and elastic coefficients of the polishing pad used in the CMP (step S75).

This processing is a preprocessing for finding a height distribution of the finished surface after polishing by the CMP, and also one of the processes for analyzing the influence of the CMP process having a long correlation distance.

The processing of step S75 is the same as that described in the fifth preferred embodiment with reference to FIGS. 13 to 15, and its description is omitted here.

Subsequently, a stress distribution calculation part 76 calculates a two-dimensional distribution of the stress exerted on the polishing pad (step S76).

The processing of step S76 is the same as that of step S66 described in the sixth preferred embodiment, and its description is omitted here.

As previously described in the sixth preferred embodiment, large stress is exerted on such an area that the change amount of the polishing pad is large, and this area is polished promptly. Whereas in such an area that no distortion occurs, the stress is zero, making it difficult to polish this area. Based on this, a polish shape calculation part 77 calculates a two-dimensional distribution image of the irregularities of the processing surface after polishing (step S77).

The height of the processing surface after polishing can be obtained as follows. Firstly, a polish amount (Å) of an calculation object area is obtained by multiplying the following items: (i) a polish rate (Å/sec) to be determined by the material of the processing surface, the material of the polishing pad, and revolution etc.; (ii) a stress value (pascal) exerted on the polishing pad in the calculation object area; and (iii) a polish time (sec). The obtained polish amount is then subtracted from the height of the calculation object area of the processing surface before polishing.

Since the area subjected to the highest stress, namely, the uppermost projecting area on the processing surface, is large in polish rate, the polish shape calculation part 77 can express the situation that the substrate is being planarized. This provides a two-dimensional distribution image of the irregularities of the processing surface after polishing.

Thereafter, a flag data creation part 78 sets a flag to the obtained two-dimensional distribution image of the irregularities of the processing surface after polishing, based on a preset threshold value in the height of the processing surface after polishing.

Specifically, presetting upper and lower limit values in the height of the projected area on the processing surface after polishing, the height at each coordinate in the two-dimensional distribution image of the irregularities of the processing surface after polishing, which is obtained in step S77, is compared with the upper and lower limit values, and the result is outputted as flag data by setting the following flags (step S78). For example, above the upper limit value, it is a high projected area and a first flag is set. Below the lower limit value, it is a low projected area and a second flag is set.

The upper and lower limit values in the height of a projected area may be inputted as an external parameter to the two-dimensional distribution processor 70. For sake of simplicity, the following method may be employed. That is, a mean value of all the heights of the projected areas in the sub-chips A to N is calculated, and upper and lower limit values are set based on a deviation from the mean value.

The processings of steps S72 to S78 are executed to the entire first to the Nth processes. If the judgment result of step S79 is that the flag processing has been executed to all the processes, the two-dimensional distribution processor 70 outputs flag data D10 about the respective processes. If any non-processed process remains, the processings of steps S72 to S78 are executed.

G-2. Operation and Effect

As described above, with the use of the processor of two-dimensional distribution of pattern densities and the processing method in the seventh preferred embodiment, it is possible to display the two-dimensional distribution image of pattern densities capable of taking a full view of a transfer mask, in particular, the two-dimensional distribution image of pattern densities showing only the components that are factors contributing to the phenomenon having a long correlation distance. It is therefore possible to obtain a two-dimensional distribution image suitable for analyzing the phenomenon having a long correlation distance.

Further, the execution of Fourier transform to the two-dimensional distribution image of pattern densities DP in step S72 will automatically result in the introduction of cyclic boundary condition. That is, it is calculated that in the reverse Fourier image (i.e., the real spatial image), sub-chips are continuously disposed at spatial intervals in such a fashion that the left end of one sub-chip is present on the right side of the right end of other sub-chip. The introduction of the coordinate data about the blank portion corresponding to the dicing line in step S71 is to introduce such cyclic boundary condition.

Also on an actual semiconductor substrate, a plurality of sub-chips are arrayed by repeating exposure shot with the use of the same transfer mask while displacing the transfer mask such that a first exposure shot is adjacent to a second exposure shot. Therefore, the introduction of the above-mentioned cyclic boundary condition permits an analysis that highly matches an actual wafer process, thus leading to a high accuracy evaluation even when a process has such a long correlation distance as extending to the whole semiconductor substrate.

The visualization of a singular point in the two-dimensional distribution image of the processing surface after polishing facilitates evaluation and analysis taking into consideration the influences due to the physical factors such as the shape, material, and revolution of the pad in the CMP process.

Modification and correction to design data are possible because the two-dimensional distribution image of the processing surface after polishing is calculated in step S77, and the flag data creation part 78 sets a flag to this two-dimensional distribution image based on the preset threshold value of the height of the processing surface after polishing.

In addition, when calculating the two-dimensional distribution image of the irregularities of the processing surface after polishing, the characteristics of chemicals and slurry used for the polishing may be inputted as a process parameter. By doing so, it is possible to consider how the polished state depends on the characteristic of the chemicals and the characteristic of slurry, thus providing high accuracy evaluation in the analysis of the chemical aspect of CMP.

For example, when polishing a silicon oxide film or aluminum, it is necessary to cut hard alumina formed on the surface of aluminum by using slurry containing fine powder of silica or alumina. When polishing copper, the same slurry as in the case with aluminum cannot be used because copper is soft and easily oxidized. Thus, the two-dimensional distribution image of the irregularities of the processing surface after polishing can be obtained with accuracy by taking the influences of chemicals and slurry into consideration. This leads to high accuracy evaluation in the analysis of the chemical aspect of CMP.

H. Eight Preferred Embodiment

The two-dimensional distribution processors 30, 40, 50, 60, and 70 in the third to seventh preferred embodiments are configured to output the flag data D6 to D10 in units of processes, as a two-dimensional distribution image visualizing a singular point. After various physical phenomena are evaluated and analyzed with the use of the flag data D6, D7, D8, D9, or D10, the flag data in units of processes are preferably synthesized to obtain flag data in units of sub-chips.

Followings are a flag data synthesizing method and a flag data conversion device used in a mask data processing method and mask data processor according to an eighth preferred embodiment of the present invention.

H-1. Flag Data Synthesizing Method

Figure 20:
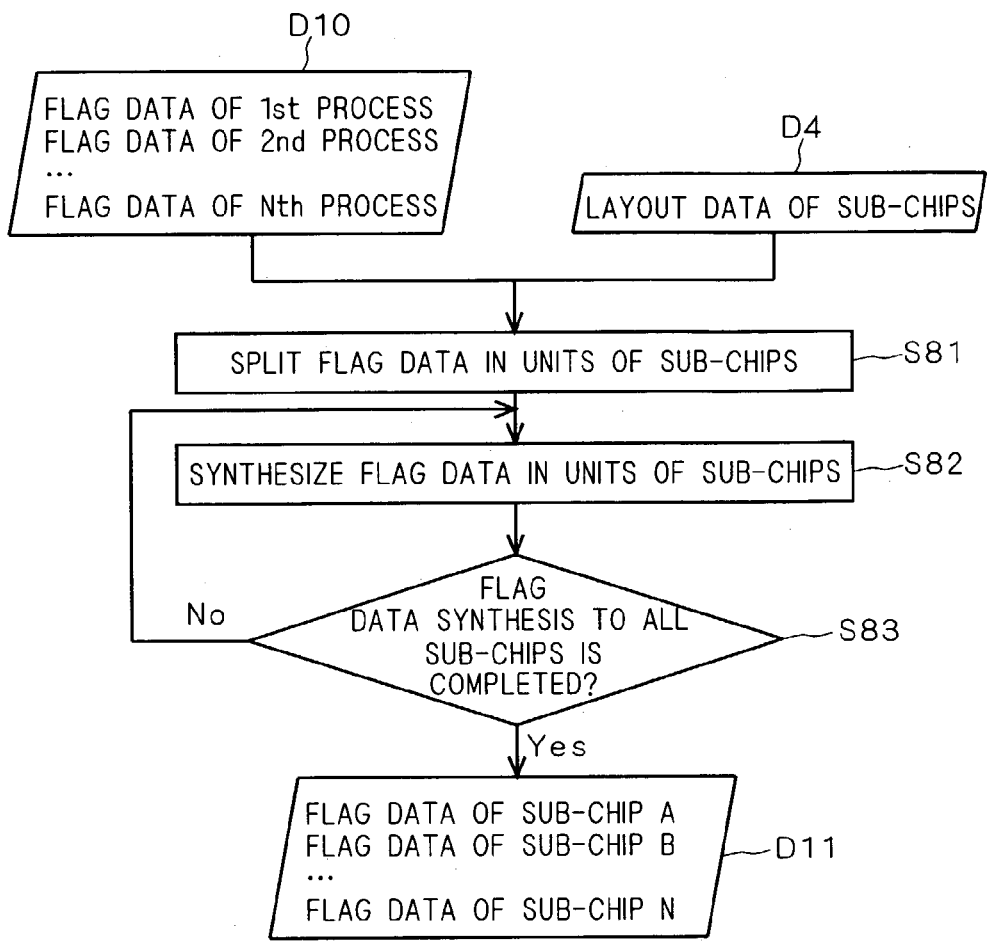
FIG. 20 is a flowchart to explain a flag data synthesizing method according to an eighth preferred embodiment of the present invention.

A flag data synthesizing method will be described with reference to the configuration of a flag data conversion device 80 in FIG. 21 and by using the flowchart in FIG. 20.

Figure 21:
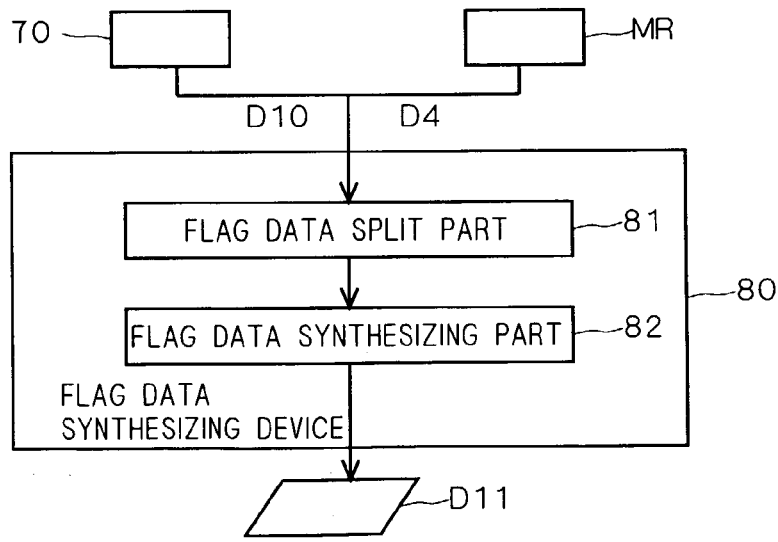
FIG. 21 is a block diagram to explain a flag data conversion device in the eighth preferred embodiment.

Referring to FIG. 21, a flag data is synthesized based on the flag data in units of processes D10, which is created for example by the two-dimensional distribution processor 70 shown in FIG. 19, and layout data in units of sub-chips D4.

Specifically, when the flag data in units of processes D10 and layout data in units of sub-chips D4 are respectively inputted from the two-dimensional distribution processor 70 and layout data storage device MR to the flag data conversion device 80, a flag data split part 81 splits the flag data in units of processes into a flag data in units of sub-chips (step S81).

The file of the flag data in units of processes stores collectively the data of the two-dimensional distribution of the irregularities of the processing surface after polishing, which are obtained in the respective processes. The processing of step S81 is to split the flag data in this file in units of sub-chips and fetch the split data.

Figures 22, 23:
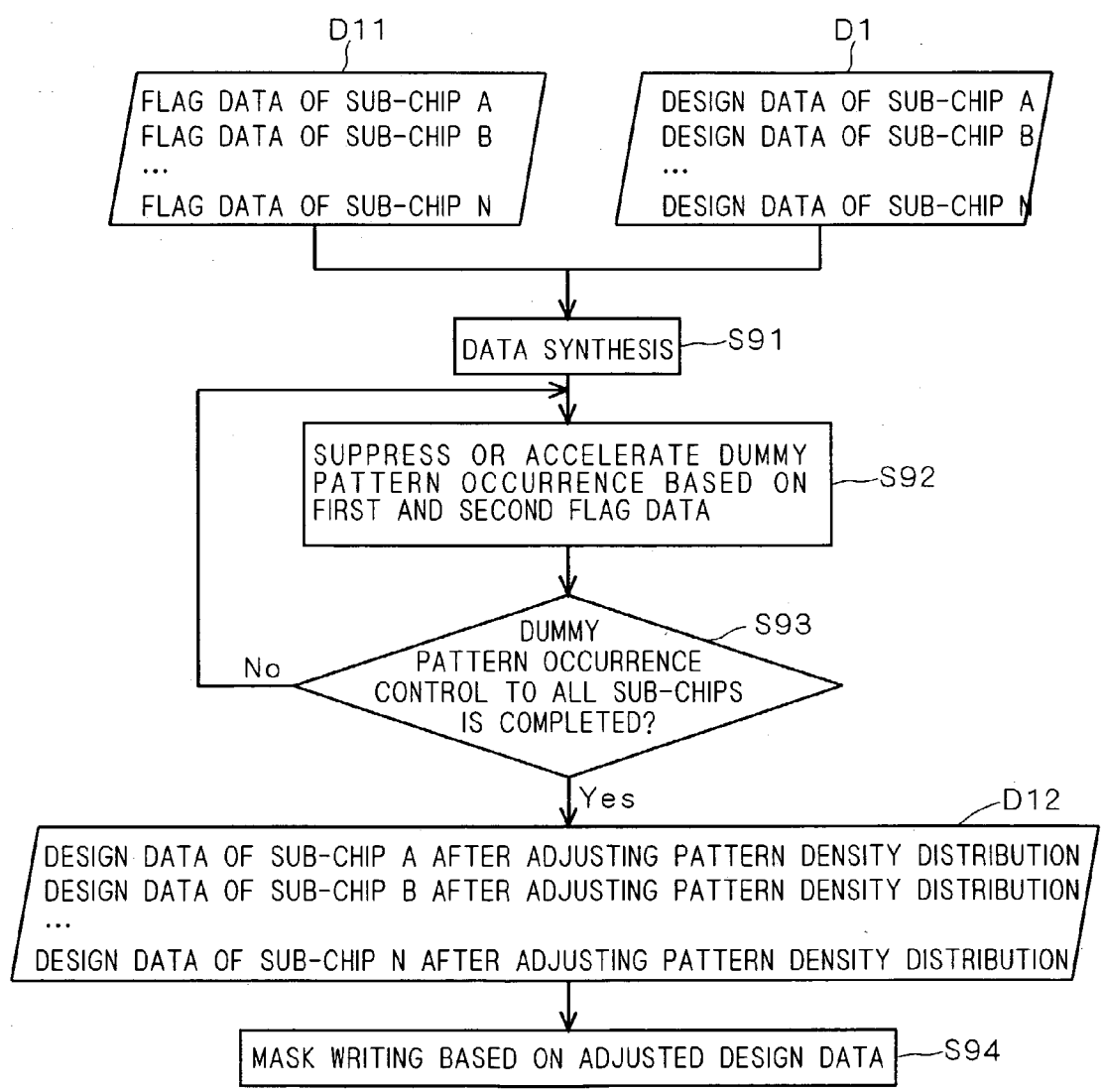
FIG. 22 is a diagram to illustrate schematically the state that a flag data is split in units of sub-chips.
FIG. 23 is a flowchart to explain a design data adjusting method according to a ninth preferred embodiment of the present invention.

The state that a flag data is split in units of sub-chips is illustrated schematically in FIG. 22.

In FIG. 22, with respect to the first to Nth processes, the flag data of the sub-chips A to N are sequentially arranged in a matrix.

The sub-chip layout data D4 also contain offset data in units of sub-chips. The processing for subtracting offset data from the flag data in units of processes is also performed in step S81.

That is, the offset data in units of sub-chips are, as described previously, data of the length to be added to the coordinate of a pattern graphic data in order to avoid any overlap among a plurality of sub-chips to be formed on a semiconductor substrate. The offset data is removed because this data is not used when synthesizing flag data of the individual processes are synthesized in units of sub-chips.

Subsequently, a flag data synthesizing part 82 synthesizes the flag data split in units of sub-chips, in units of sub-chips (step S82).

This processing is to synthesize and output, for example, the flag data of the first to Nth processes of the sub-chip A in the matrix shown in FIG. 22. This data is hereinafter referred to as "the flag data of the sub-chip A." This is true for the sub-chips B to N. The processing of step S82 is performed to all the sub-chips. If the judgment result of step S83 is that the flag data of all the sub-chips are synthesized, the flag data conversion device 80 outputs flag data in units of sub-chips D11. On the other hand, if any non-processed process remains, the processing of step S82 is executed.

H-2. Operation and Effect

After analyzing the physical phenomenon such as microloading effect in the CMP process and dry etching process, the analysis result is synthesized in units of sub-chips and then fed back to the design data and mask data. With the use of the flag data conversion device and synthesizing method of the seventh preferred embodiment, the flag data in units of sub-chips D11 can be obtained easily, and the feedback of this data to the design data and mask data facilitates adjustment to the design data and mask data.

In the foregoing, the flag data is synthesized by using the flag data in units of processes D10, which is created by the two-dimensional distribution processor 70 shown in FIG. 19. It is of course possible to use the flag data D6 to D10 outputted from the two-dimensional distribution processors 30, 40, 50, 60, and 70, respectively.

I. Ninth Preferred Embodiment

A design data adjusting method and an adjusting device using the flag data in units of sub-chips D11 outputted from the flag data conversion device 80 in the eighth preferred embodiment will be described as a mask data processing method and mask data processor according to a ninth preferred embodiment.

I-1. Design Data Adjusting Method

The design data adjusting method will be described with reference to the configuration of a design data adjusting device 90 in FIG. 24 and by using the flowchart in FIG. 23.

Figure 24:
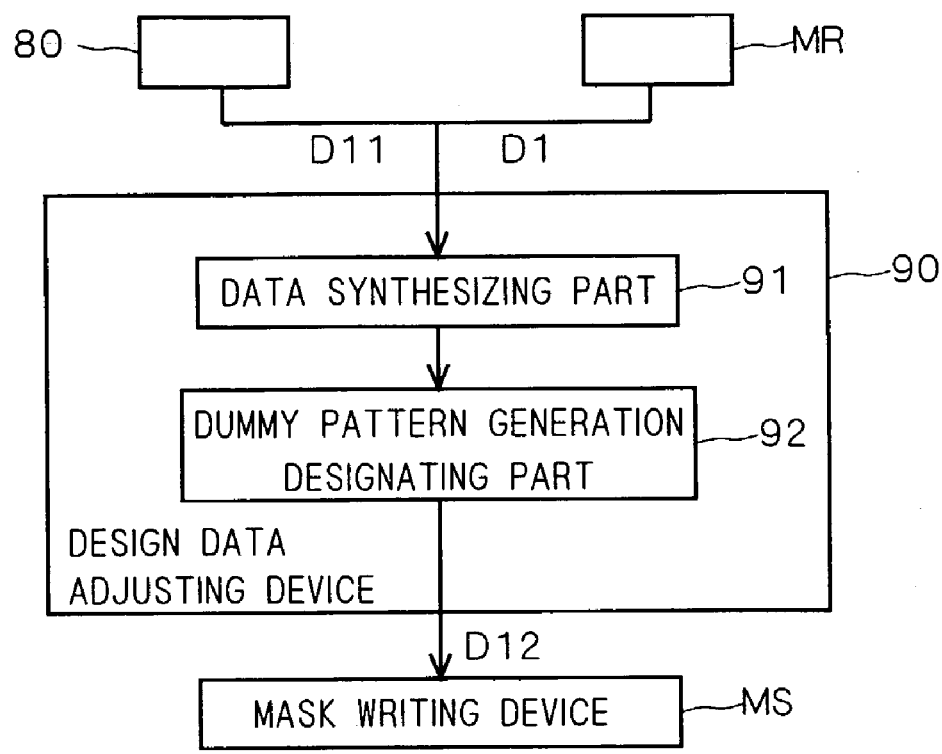
FIG. 24 is a block diagram to explain the design data adjusting method in the ninth preferred embodiment.

Referring to FIG. 24, the design data is adjusted based on the flag data in units of sub-chips D11 created by the flag data conversion device 80 in FIG. 21, and the individual sub-chip design data D1.

When the flag data conversion device 80 and layout data storage device MR input the flag data D11 and sub-chip design data D1, respectively, to the design data adjusting device 90, a data synthesizing part 91 synthesizes both data to create synthetic data (step S91).

This processing is to add the flag data in units of processes to the individual sub-chip design data D1.

Subsequently, a dummy pattern generation designating part 92 searches a first flag from the flag data in units of processes.

For the sake of simplicity, it is assumed that the flag data in units of sub-chips D11 outputted from the flag data conversion device 80 is one created based on the flag data in units of processes D6, which is outputted from the two-dimensional distribution processor 30 described with reference to FIG. 7. It is also assumed that in the flag data D6, first and second flags are set to the two-dimensional distribution image of pattern densities based on the upper and lower limit values in pattern density.

The first flag is set to the area where the pattern density is too high. Therefore, when the first flag is present, the dummy pattern generation designating part 92 controls to suppress the occurrence of dummy patterns for adjusting pattern densities in the corresponding part of the design data D1.

Subsequently, the second flag data is searched from the flag data in units of processes. As described above, the second flag is set to the area where the pattern density is too low. Therefore, when the second flag is present, the dummy pattern generation designating part 92 controls to positively generate dummy patterns for adjusting pattern density in the corresponding part of the design data D1 (step S92).

The processing of step S92 is executed to all the sub-chips. In step S93, when the dummy pattern generation control is executed to all the sub-chips, there is outputted an adjusted design data D12 which is obtained by adjusting the pattern density distribution in units of sub-chips. If any non-processed sub-chip remains, the processing of step S92 is performed.

The adjusted design data D12 is applied for example to a mask writing device MS, and mask writing is executed based on the adjusted design data D12 (step S94).

I-2. Operation and Effect

Thus, with the use of the design data adjusting device and adjusting method of the ninth preferred embodiment, the dummy pattern generation is limited in the area where the first flag is present, whereas the dummy pattern generation is enhanced in the area where the second flag is present. It is therefore possible to adjust the layout pattern density in the initial design data. In addition, the use of the adjusted design data improves process uniformity and processing accuracy in the CMP process and dry etching process.

While the invention has been shown and described in detail, the foregoing description is in all aspects illustrative and not restrictive. It is therefore understood that numerous modifications and variations can be devised without departing from the scope of the invention.

What is claimed is:

1. A mask data processor for processing mask data of a transfer mask used for forming on a semiconductor substrate a plurality of sub-chips on a region of the semiconductor substrate other than a region for forming a main chip, said mask data processor comprising:

a pattern-density data generation device that processes a design data in units of said sub-chips and outputs, for application to the transfer mask, a pattern density per unit region of a pattern graphic contained in the individual processes for forming said sub-chips, as pattern density data in units of said sub-chips, wherein said pattern-density data generation device includes:

a data execution part that creates said mask data by receiving the design data split in units of said sub-chips and mask data creation specification data defining at least the specification of said mask data;

a graphic area calculation part that calculates the area of said pattern graphic in the individual processes for forming said sub-chips contained in said mask data; and a pattern-density data calculation part that calculates the pattern density per unit region of said pattern graphic as the pattern density data in units of said sub-chips.

2. The mask data processor according to claim 1, wherein said data execution part creates said mask data by performing arithmetic execution to said design data in units of said sub-chips, based on said mask data creation specification data; and said pattern-density data calculation part divides said pattern graphic into pattern elements per unit region and calculates the pattern densities of said pattern elements as said pattern density data.

3. The mask data processor according to claim 2, wherein said graphic area calculation part includes the function of eliminating any overlap of said pattern graphic.

4. The mask data processor according to claim 1, further comprising:

a pattern-density data conversion device that receives said pattern density data of said sub-chips outputted from said pattern-density data generation device, and converts the received data to pattern density data in units of formation processes.

5. The mask data processor according to claim 4, wherein said pattern-density data conversion device includes:

a pattern-density data split part that receives said pattern density data in units of said sub-chips and splits the received data in units of formation processes; and a pattern-density data synthesizing part that synthesizes said pattern density data split in units of said formation processes, in units of formation processes common to said sub-chips, and outputs the synthesized data as pattern density data in units of said formation processes.

6. The mask data processor according to claim 5, wherein said pattern-density data split part includes the function of also receiving layout data of said sub-chips and adding offset data in units of said sub-chips contained in said layout data, to coordinate data of said pattern density data split in units of said formation processes.

7. The mask data processor according to claim 4, further comprising:

a two-dimensional distribution processor that receives said pattern density data in units of said formation processes from said pattern-density data conversion device and expands the received data to two-dimension based coordinate data, and then outputs the expanded data as two-dimensional distribution image of pattern densities in units of said formation processes, wherein said two-dimensional distribution processor includes a flag data creation part that creates and outputs flag data in units of said formation processes by adding at least one type flag to said two-dimensional distribution image of pattern densities in units of said formation processes, based on a predetermined threshold value in pattern density.

8. The mask data processor according to claim 7, further comprising:
a flag data conversion device that receives said flag data in units of said formation processes and converts the received data to flag data in units of sub-chips.

9. The mask data processor according to claim 8, wherein said flag data conversion device includes:
a flag data split part that receives said flag data in units of said formation processes and splits the received data in units of sub-chips; and
a flag data synthesizing part that synthesizes said flag data split in units of said sub-chips, in units of sub-chips common to said formation processes, and outputs the synthesized data as flag data in units of said sub-chips.

10. The mask data processor according to claim 8, further comprising:
a design data adjusting device that receives said design data split in units of said sub-chips and said flag data in units of said sub-chips,
said design adjusting device having:
a data synthesizing part that obtains synthetic data by creating a layout pattern in units of said formation processes of the respective sub-chips based on said design data in units of said sub-chips, and incorporating said layout pattern into said flag data in units of said sub-chips; and
a dummy pattern generation designating part that searches the type of a flag from said synthetic data and controls the generation of a dummy pattern for adjusting pattern densities depending on the type of the flag, and then outputs a design data having a controlled pattern density distribution in units of said sub-chips.

11. The mask data processor according to claim 4, further comprising a two-dimensional distribution processor having:
a pattern-density two-dimensional distribution calculation part that receives said pattern density data in units of said formation processes from said pattern-density data conversion device and expands the received data to two-dimension based coordinate data, and outputs the expanded data as two-dimensional distribution image of pattern densities in units of formation processes;
a Fourier calculation part that performs Fourier transform of said two-dimensional distribution image of pattern densities in units of said formation processes, and outputs a two-dimensional Fourier image;
a spatial filter part that performs spatial filtering of said two-dimensional Fourier image so as to permit only passage of components having a predetermined spatial frequency;
a reverse Fourier calculation part that performs reverse Fourier transform of said two-dimensional Fourier image after passing through said spatial filtering, and outputs a two-dimensional reverse Fourier image; and
a flag data creation part that adds at least one type flag to said two-dimensional reverse Fourier image based on a predetermined threshold value in pattern density, and outputs the obtained data as flag data in units of said formation processes.

12. The mask data processor according to claim 4, further comprising a two-dimensional distribution processor having:
a pattern-density two-dimensional distribution calculation part that receives said pattern density data in units of said formation processes from said pattern-density data conversion device and expands the received data to two-dimension based coordinate data, and outputs the expanded data as two-dimensional distribution image of pattern densities in units of formation processes;
a Fourier calculation part that performs Fourier transform of said two-dimensional distribution image of pattern densities in units of said formation processes and outputs a two-dimensional Fourier image;
a spatial filter part that performs spatial filtering of said two-dimensional Fourier image so as to permit only passage of components having a predetermined spatial frequency;
a reverse Fourier calculation part that performs reverse Fourier transform of said two-dimensional Fourier image after passing through said spatial filtering and outputs a two-dimensional reverse Fourier image;
a pad shape calculation part that calculates, based on said two-dimensional reverse Fourier image, a two-dimensional distribution image of a polishing pad used for chemical mechanical polishing of a laminating film laminated on said two-dimensional reverse Fourier image, in such a state that said polishing pad is pressed against said laminating film; and
a flag data creation part that adds at least one type flag to said two-dimensional distribution image of said polishing pad based on a predetermined threshold value in change amount, and outputs the obtained data as flag data in units of said formation processes,
wherein said pad shape calculation part has the functions of:
obtaining a two-dimensional distribution of the height of a processing surface before chemical mechanical polishing of said laminating film by an arithmetic execution of multiplying the pattern densities of individual areas in said two-dimensional reverse Fourier image by the thickness of said laminating film; and
obtaining a two-dimensional distribution image of said polishing pad based on the elastic coefficients of said polishing pad and said two-dimensional distribution of the height of said processing surface.

13. The mask data processor according to claim 4, further comprising a two-dimensional distribution processor having:
a pattern-density two-dimensional distribution calculation part that receives said pattern density data in units of said formation processes from said pattern-density data conversion device and expands the received data to two-dimension based coordinate data, and outputs the expanded data as two-dimensional distribution image of pattern densities in units of formation processes;
a Fourier calculation part that performs Fourier transform of said two-dimensional distribution image of pattern densities in units of said formation processes and outputs a two-dimensional Fourier image;
a spatial filter part that performs spatial filtering of said two-dimensional Fourier image so as to permit only passage of components having a predetermined spatial frequency;
a reverse Fourier calculation part that performs reverse Fourier transform of said two-dimensional Fourier image after passing through said spatial filtering and outputs a two-dimensional reverse Fourier image;
a pad shape calculation part that calculates, based on said two-dimensional reverse Fourier image, a two-dimensional distribution image of a polishing pad used for chemical mechanical polishing of a laminating film laminated on said two-dimensional reverse Fourier image, in such a state that said polishing pad is pressed against said laminating film;

a stress distribution calculation part that calculates a two-dimensional distribution image of stress exerted on said polishing pad, based on said two-dimensional distribution image of said polishing pad; and a flag data creation part that adds at least one type flag to said two-dimensional distribution image of stress based on a predetermined threshold value in stress value, and outputs the obtained data as flag data in units of said formation processes, wherein said stress distribution calculation part has the function of obtaining said two-dimensional distribution of stress based on the elastic coefficients of said polishing pad and a two-dimensional distribution of the height of a processing surface having a height distribution, and wherein said pad shape calculation part has the functions of:

obtaining a two-dimensional distribution of the height of a processing surface before chemical mechanical polishing of said laminating film by an arithmetic execution of multiplying the pattern densities of individual areas in said two-dimensional reverse Fourier image by the thickness of said laminating film; and obtaining a two-dimensional distribution image of said polishing pad based on the elastic coefficients of said polishing pad and said two-dimensional distribution of the height of said processing surface.

14. The mask data processor according to claim 4, further comprising a two-dimensional distribution processor having:

a pattern-density two-dimensional distribution calculation part that receives said pattern density data in units of said formation processes from said pattern-density data conversion device and expands the received data to two-dimension based coordinate data, and outputs the expanded data as two-dimensional distribution image of pattern densities in units of formation processes;

a Fourier calculation part that performs Fourier transform of said two-dimensional distribution image of pattern densities in units of said formation processes and outputs a two-dimensional Fourier image;

a spatial filter part that performs spatial filtering of said two-dimensional Fourier image so as to permit only passage of components having a predetermined spatial frequency;

a reverse Fourier calculation part that performs reverse Fourier transform of said two-dimensional Fourier image after passing through said spatial filtering and outputs a two-dimensional reverse Fourier image;

a pad shape calculation part that calculates, based on said two-dimensional reverse Fourier image, a two-dimensional distribution image of a polishing pad used for chemical mechanical polishing of a laminating film laminated on said two-dimensional reverse Fourier image, in such a state that said polishing pad is pressed against said laminating film;

a stress distribution calculation part that calculates a two-dimensional distribution image of stress exerted on said polishing pad, based on said two-dimensional distribution image of said polishing pad;

a polish shape calculation part that calculates a two-dimensional distribution image of irregularities of said laminating film after polishing, based on said two-dimensional distribution image of stress; and a flag data creation part that adds at least one type flag to said two-dimensional distribution image of the irregularities of said laminating film after polishing, based on a predetermined threshold value in height, and outputs the obtained data as flag data in units of said formation processes, wherein said polish shape calculation part has the function of obtaining a two-dimensional distribution image of the irregularities of said laminating film after polishing, by arithmetic executions of: (i) calculating a polish amount in a calculation object area based on a polish rate to said laminating film, a stress value exerted on said polishing pad in said calculation object area, and a polish time, and (ii) subtracting said polish amount from the height of said laminating film before polishing in said calculation object area, wherein said stress distribution calculation part has the function of calculating said two-dimensional distribution of stress based on the elastic coefficients of said polishing pad and a two-dimensional distribution of the height of a processing surface having a height distribution, and wherein said pad shape calculation part has functions of:

obtaining a two-dimensional distribution of the height of a processing surface before chemical mechanical polishing of said laminating film by an arithmetic execution of multiplying the pattern densities of individual areas in said two-dimensional reverse Fourier image by the thickness of said laminating film; and obtaining a two-dimensional distribution image of said polishing pad based on the elastic coefficients of said polishing pad and said two-dimensional distribution of the height of said processing surface.

* * * * *